(12) United States Patent
Yamazaki et al.

(10) Patent No.: US 8,741,063 B2
(45) Date of Patent: Jun. 3, 2014

(54) SUBSTRATE PROCESSING APPARATUS AND METHOD OF MANUFACTURING SEMICONDUCTOR DEVICE

(75) Inventors: Hirohisa Yamazaki, Toyama (JP); Satoshi Okada, Toyama (JP); Tsutomu Kato, Takaoka (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/510,572

(22) Filed: Jul. 28, 2009

(65) Prior Publication Data

US 2010/0035437 A1    Feb. 11, 2010

(30) Foreign Application Priority Data

Jul. 30, 2008    (JP) ................................. 2008-196562

(51) Int. Cl.
*C23C 16/458*    (2006.01)
(52) U.S. Cl.
USPC ............................ 118/715; 118/724; 118/725
(58) Field of Classification Search
USPC .......................................... 118/715, 724, 725
See application file for complete search history.

(56) References Cited

U.S. PATENT DOCUMENTS

| | | | | |
|---|---|---|---|---|
| 5,709,543 | A * | 1/1998 | Shimazu | 432/241 |
| 6,875,280 | B2 * | 4/2005 | Ikeda et al. | 118/719 |
| 2003/0175426 | A1 * | 9/2003 | Shiratori | 427/255.37 |
| 2005/0287806 | A1 * | 12/2005 | Matsuura | 438/680 |
| 2006/0205213 | A1 * | 9/2006 | Ozaki et al. | 438/680 |
| 2006/0216418 | A1 * | 9/2006 | Matsuura | 427/248.1 |
| 2006/0258174 | A1 * | 11/2006 | Sakai et al. | 438/785 |
| 2007/0234961 | A1 * | 10/2007 | Takahashi et al. | 118/723 R |
| 2008/0035055 | A1 * | 2/2008 | Dip et al. | 118/715 |

FOREIGN PATENT DOCUMENTS

| | | | | |
|---|---|---|---|---|
| JP | 08186081 | | 7/1996 | |
| JP | 2000311862 | | 11/2000 | |
| JP | 2003-158081 | * | 5/2003 | .............. C23C 16/44 |
| JP | 2005057079 | | 3/2005 | |
| KR | 20020061523 | | 7/2002 | |

* cited by examiner

*Primary Examiner* — Parviz Hassanzadeh
*Assistant Examiner* — Satish Chandra
(74) *Attorney, Agent, or Firm* — Brundidge & Stanger, P.C.

(57) ABSTRACT

Substrate processing uniformity is improved in the surfaces of wafers and between the wafers. A substrate processing apparatus including: a substrate holder including a substrate stacking part configured to hold a plurality of vertically stacked substrates and a cylinder part disposed under the substrate stacking part to enclose a lower portion of the substrate holder; an inner tube configured to accommodate the substrate holder wherein a space between the cylinder part and a lower portion of the inner tube is smaller than a space between the substrate stacking part and an upper portion of the inner tube; an outer tube configured to enclose the inner tube with a gap therebetween; a gas nozzle installed in the inner tube; a gas injection hole disposed in the gas nozzle; a source gas supply unit configured to supply a source gas to an inside of the inner tube through the gas nozzle; a gas exhaust outlet disposed in a sidewall of the inner tube such that the inside of the inner tube communicates with the gap through the plurality of gas exhaust outlets; an exhaust unit configured to exhaust the gap so as to create a gas stream inside the inner tube in a direction from the gas injection hole to the plurality of gas exhaust outlets.

10 Claims, 18 Drawing Sheets

Fig. 11

| | VAPORIZED GAS SUPPLY 120sec | PURGE N₂ GAS SUPPLY 20sec | EXHAUST 20sec | O₃ GAS SUPPLY 120sec | PURGE N₂ GAS SUPPLY 10sec | EXHAUST 15sec |
|---|---|---|---|---|---|---|
| TEMAZr GAS (VAPORIZED GAS SUPPLY PIPE) | 0.35g/min | | | 0g/min | | |
| N₂ GAS (1ST INERT GAS SUPPLY PIPE) | 8slm | 5slm | 0slm | 2slm | 4slm | 0slm |
| N₂ GAS (CARRIER GAS SUPPLY PIPE) | 1slm | 0slm | | 6slm | 0slm | |
| O₃ GAS (REACTION GAS SUPPLY PIPE) | | | | | | |
| N₂ GAS (2ND INERT GAS SUPPLY PIPE) | 2slm | 4slm | | 0slm | 4slm | 0slm |

| | CLEANING GAS SUPPLY 270sec | SEALING 180sec | EXHAUST 180sec |
|---|---|---|---|
| BCl₃ GAS (1ST CLEANING GAS SUPPLY PIPE) | 1slm | 0slm | 0slm |
| O₂ GAS (1ST CLEANING GAS SUPPLY PIPE) | 0.02slm | 0slm | 0slm |
| N₂ GAS (3RD INERT GAS SUPPLY PIPE) | 0.25slm | 0slm | 0slm |
| PRESSURE | | 100Torr | |

Fig. 13

|  |  | BEFORE PROCESS | VAPORIZED GAS SUPPLY | | PURGE | REACTION GAS SUPPLY | | PURGE |
|---|---|---|---|---|---|---|---|---|
|  |  |  | TEMAZr GAS | N₂ GAS |  | OZONE GAS | N₂ GAS |  |
| PROCESS PRESSURE | ALLOWABLE | 10~1000Pa | 10~700Pa | | 10~100Pa | 10~300Pa | | 10~100Pa |
|  | SET | 50Pa | 250Pa | | 70Pa | 100Pa | | 70Pa |
| GAS FLOWRATE | ALLOWABLE | / | 0.01~0.35g/min | 0.1~1.5slm | 0.5~20slm | 6~20slm | 0~2slm | 0.5~20slm |
|  | SET | / | 0.3g/min | 1.0slm | 12slm | 17slm | 0.5slm | 12slm |
| PROCESS TEMP | ALLOWABLE | 180~250°C | 180~250°C | | 180~250°C | 180~250°C | | 180~250°C |
|  | SET | 220°C | 220°C | | 220°C | 220°C | | 220°C |
| TIME | ALLOWABLE | / | 30~180sec | | 30~150sec | 10~300sec | | 30~90sec |
|  | SET | / | 120sec | | 60sec | 120sec | | 60sec |

Fig. 14

| | | CLEANING GAS SUPPLY | | |
|---|---|---|---|---|
| | | BCl₃ GAS | O₂ GAS | N₂ GAS |
| PROCESS PRESSURE | ALLOWABLE | 1330~26600Pa | | |
| | SET | 13300Pa | | |
| GAS FLOWRATE | ALLOWABLE | 0.001~5slm | 0~0.05slm | 0.1~1slm |
| | SET | 1slm | 1slm | 0.15slm |
| PROCESS TEMPERATURE | ALLOWABLE | 300~700°C | | |
| | SET | 540°C | | |

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2008-196562, filed on Jul. 30, 2008, in the Japanese Patent Office, the entire contents of which are hereby incorporated by reference.

BACKGROUND OF THE INVENTION

1. Field of the Invention

The present invention relates to a substrate processing apparatus configured to process a substrate and a method of manufacturing a semiconductor device.

2. Description of the Prior Art

In the related art, for example, as a manufacturing process of a semiconductor device such as a dynamic random access memory (DRAM), a substrate processing process for forming a thin film on a substrate is performed. Such a substrate processing process has been performed by using a substrate processing apparatus, which includes a substrate holder configured to hold a plurality of substrates in a state where the substrates are stacked in a horizontal position, an inner tube configured to accommodate the substrate holder, an outer tube configured to enclose the inner tube, a source gas supply unit configured to supply a source gas such as a film-forming gas or oxidation gas to the inside of the inner tube, and an exhaust unit configured to exhaust gas from a space between the outer and inner tubes so as to create a gas flow inside the inner tube. A film-forming gas or oxidation gas is horizontally supplied between substrates loaded in the inner tube.

However, in the related-art substrate processing apparatus, the velocity of source gas supplied to the center part of a surface of an upper or lower substrate among a plurality of substrates held in the substrate holder is relatively lowered, and thus the uniformity of substrate processing can be deteriorated at the substrate or between substrates.

SUMMARY OF THE INVENTION

An object of the present invention is to provide a substrate processing apparatus configured to prevent the velocity of supplied source gas from decreasing at the center surface parts of substrates held at upper or lower positions of a substrate holder in which a plurality of substrates are held, so as to improve the uniformity of substrate processing quality in the surfaces of the substrates and between the substrates, and a method of manufacturing a semiconductor device.

According to an aspect of the present invention, there is provided a substrate processing apparatus including: a substrate holder including a substrate stacking part configured to hold a plurality of vertically stacked substrates and a cylinder part disposed under the substrate stacking part to enclose a lower portion of the substrate holder, the cylinder part being disposed lower than a lowermost one of a plurality of gas exhaust outlets and a lowermost one of a plurality of gas injection holes; an inner tube configured to accommodate the substrate holder, the inner tube having an upper portion convexed outward with the plurality of gas exhaust outlets therethrough such that a space between the cylinder part and a lower portion of the inner tube is smaller than a space between the substrate stacking part and the upper portion of the inner tube; an outer tube configured to enclose the inner tube with a gap therebetween, wherein a portion of the gap at the lower portion of the inner tube is larger than a portion of the gap at the upper portion of the inner tube; a gas nozzle installed in the inner tube; the plurality of gas injection holes disposed in the gas nozzle; a source gas supply unit configured to supply a source gas to an inside of the inner tube through the gas nozzle; the plurality of gas exhaust outlet is disposed opposite to the gas nozzle in a manner that the lowermost one of the plurality of gas exhaust outlets faces the lowermost one of the plurality of gas injection holes and that the inside of the inner tube communicates with the gap through the plurality of gas exhaust outlets; an exhaust unit configured to exhaust the gap so as to create a gas stream inside the inner tube in a direction from the plurality of gas injection holes to the plurality of gas exhaust outlets.

According to another aspect of the present invention, there is provided a method of manufacturing a semiconductor device, the method including: loading a substrate holder into an inner tube, the substrate holder holding a plurality of substrates in a state where the substrate are horizontally oriented and stacked; forming thin films on the substrates by supplying a source gas to an inside of the inner tube; and unloading the substrate holder from the inner tube, wherein the forming of the thin films is performed in a state where a region of the substrate holder lower than a region of the substrate holder where the substrates are stacked is enclosed by a gas penetration preventing cylinder.

BRIEF DESCRIPTION OF THE DRAWINGS

FIG. 11 is a gas supply sequence diagram of a film-forming process relevant to the first embodiment of the present invention.

FIG. 13 is a table showing exemplary process conditions of a film-forming process relevant to the first embodiment of the present invention.

FIG. 14 is a table showing exemplary process conditions of a cleaning process relevant to the second embodiment of the present invention.

DETAILED DESCRIPTION OF THE PREFERRED EMBODIMENTS

First Embodiment of the Present Invention

A first embodiment of the present invention will be described hereinafter with reference to the attached drawings.

Figure 1:
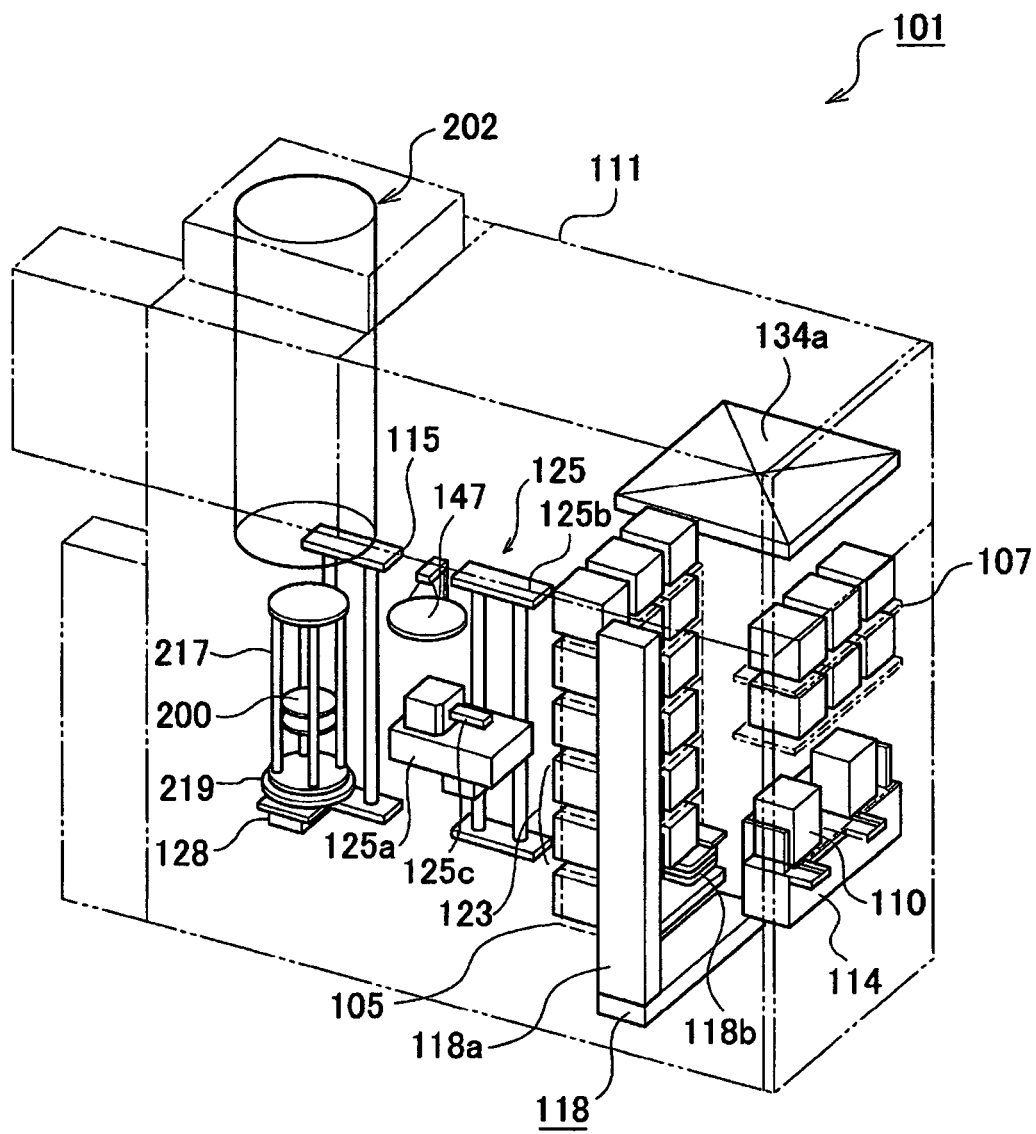
FIG. 1 is a schematic view illustrating a substrate processing apparatus relevant to a first embodiment of the present invention.
Figure 2:
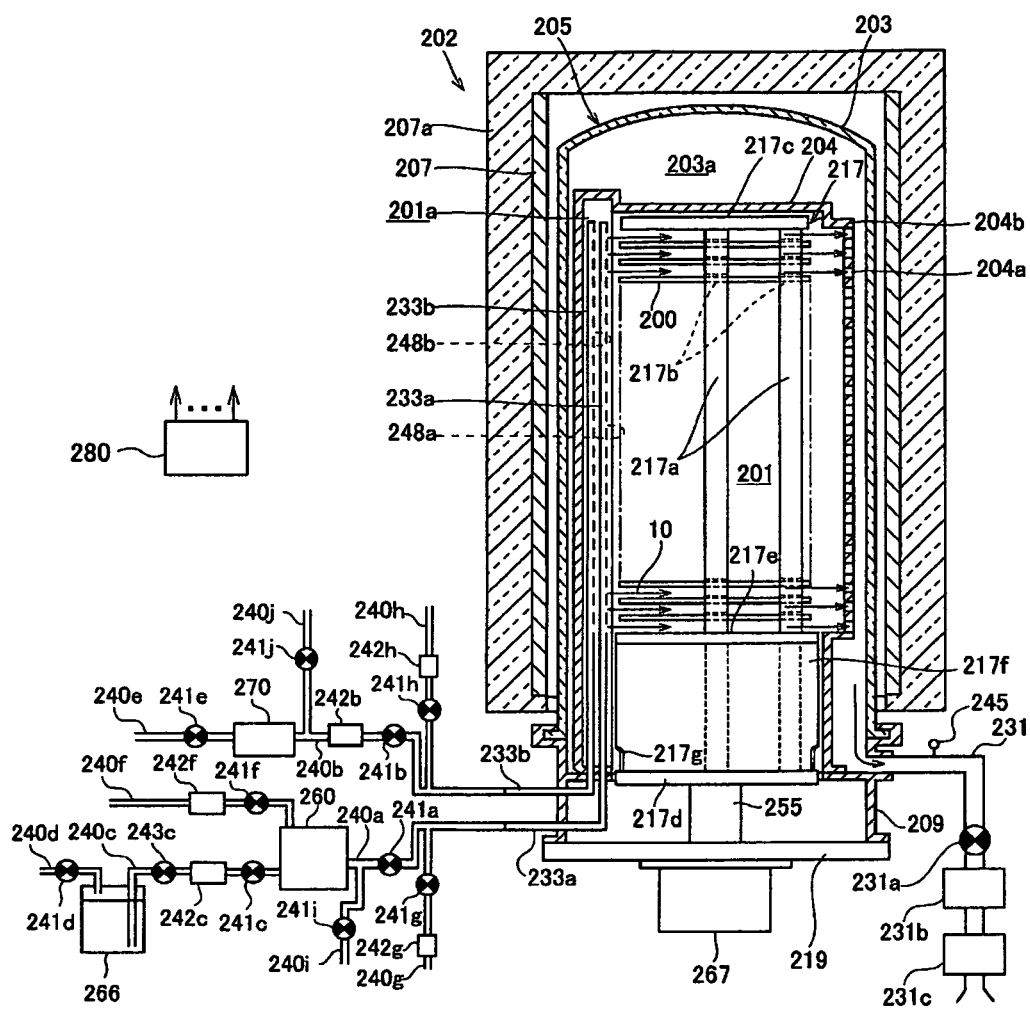
FIG. 2 is a vertical sectional view illustrating a process furnace provided in the substrate processing apparatus relevant to the first embodiment of the present invention.
Figure 3:
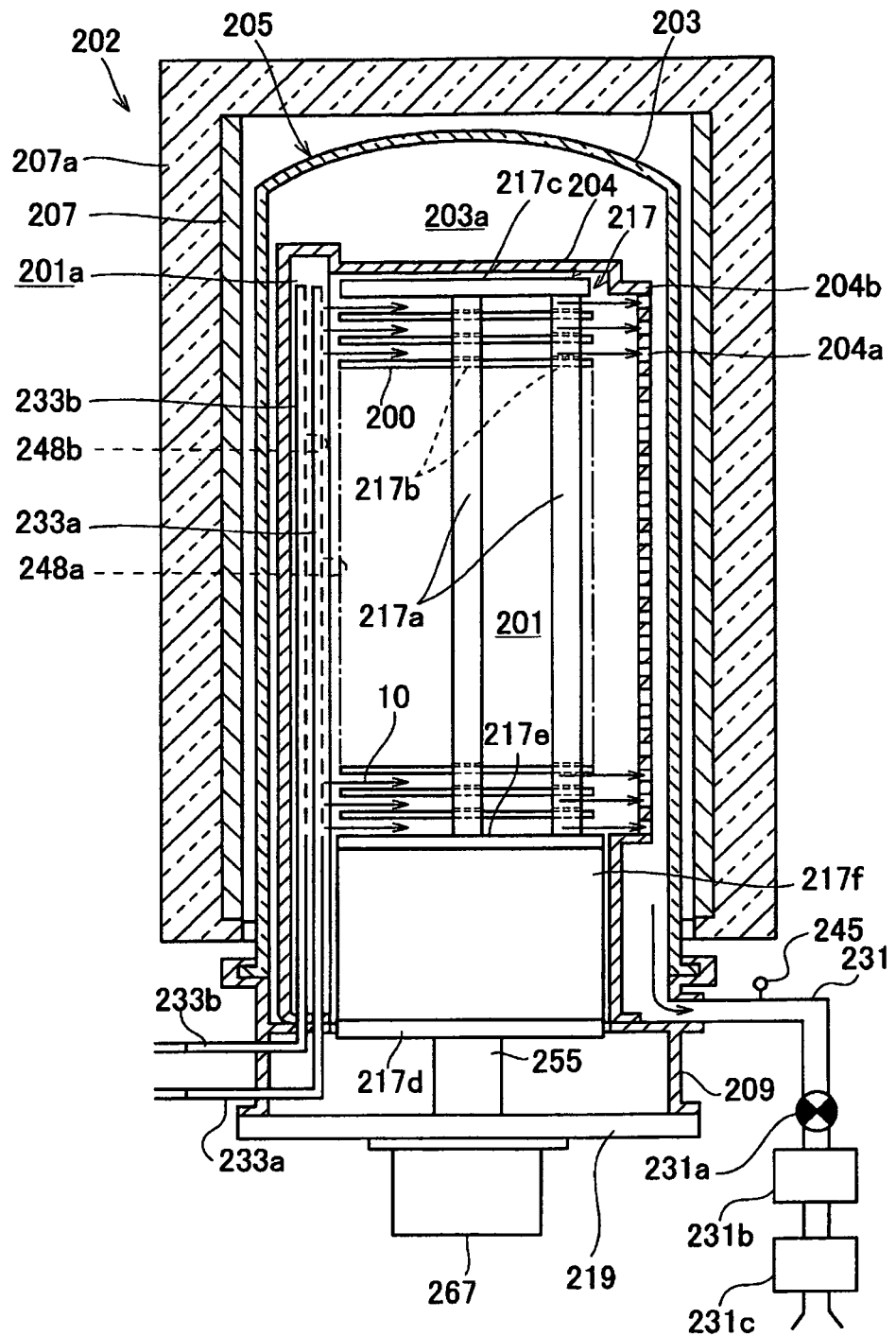
FIG. 3 illustrates a modification version of the process furnace of the substrate processing apparatus relevant to the first embodiment of the present invention.
Figure 5:
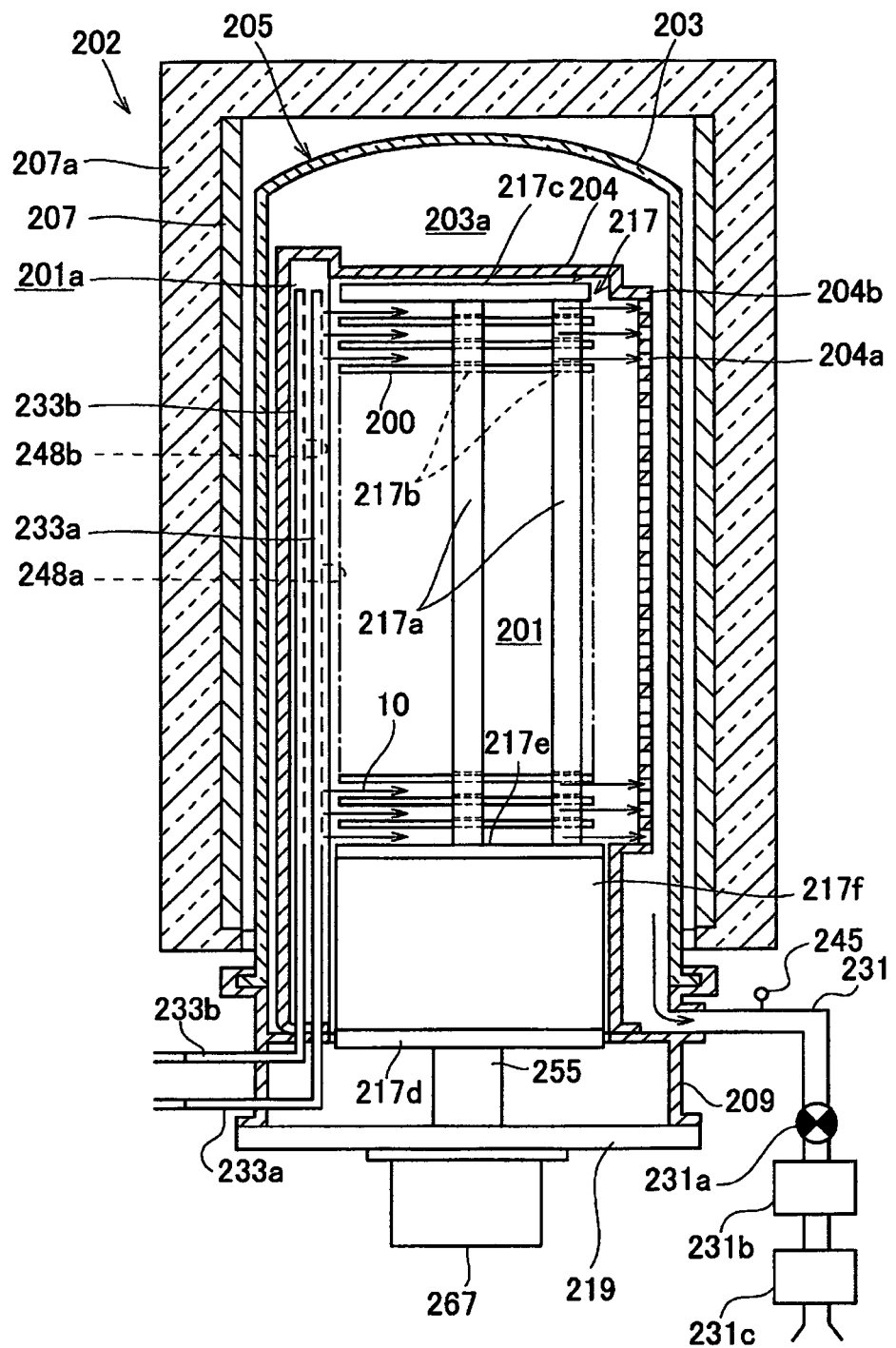
FIG. 5 is a cross sectional view illustrating a process tube provided in the substrate processing apparatus relevant to the first embodiment of the present invention.
Figure 6:
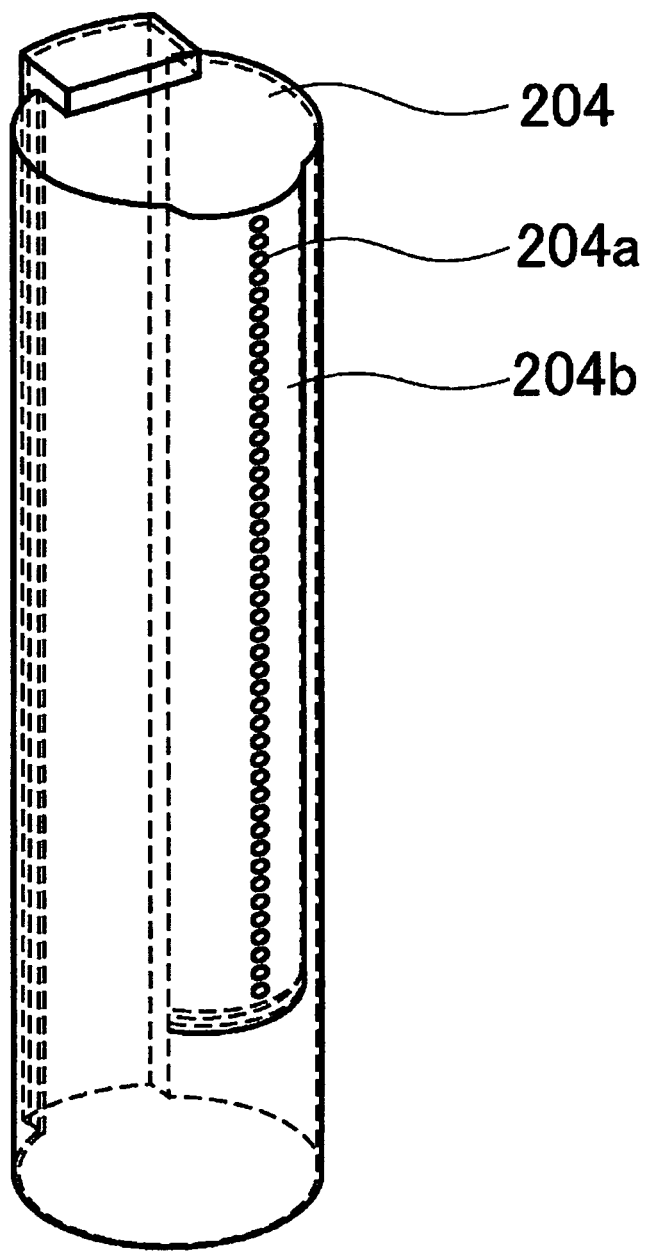
FIG. 6 is a perspective view illustrating an inner tube provided in the substrate processing apparatus relevant to the first embodiment of the present invention.
Figure 7:
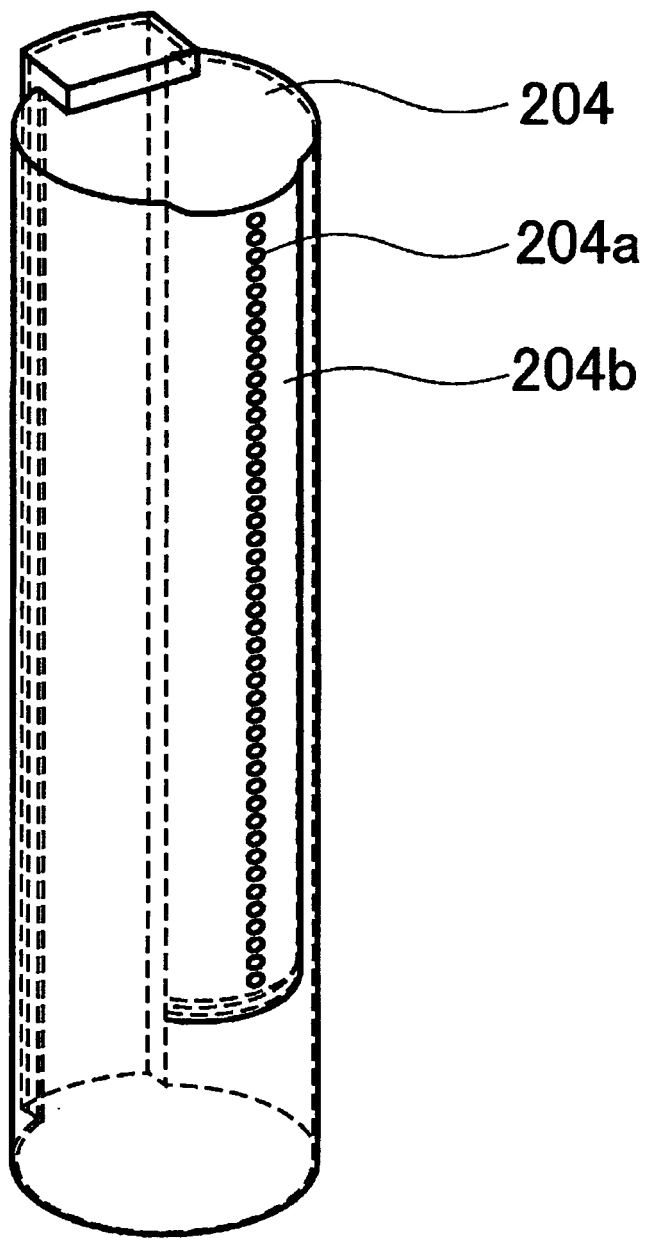
FIG. 7 illustrates a modification version of the inner tube of the substrate processing apparatus relevant to the first embodiment of the present invention.
Figure 8:
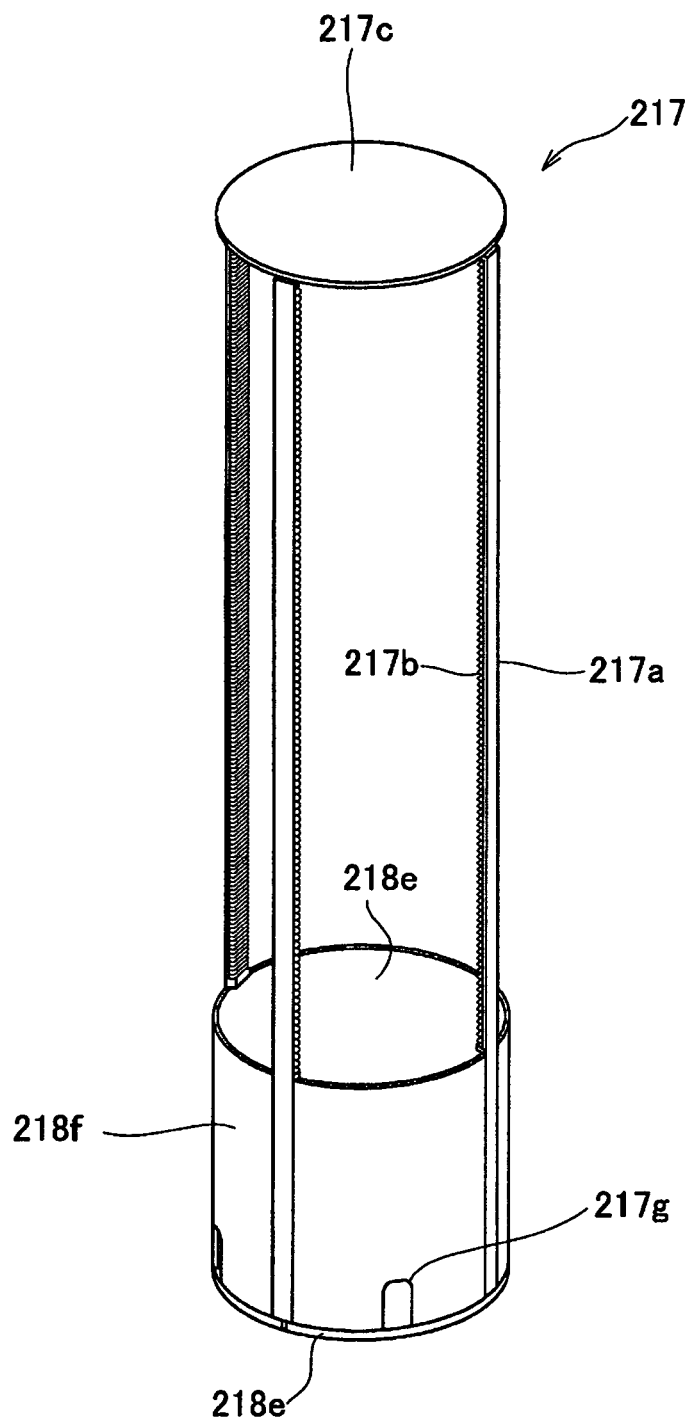
FIG. 8 is a perspective view illustrating a boat provided in the substrate processing apparatus relevant to the first embodiment of the present invention.
Figure 9:
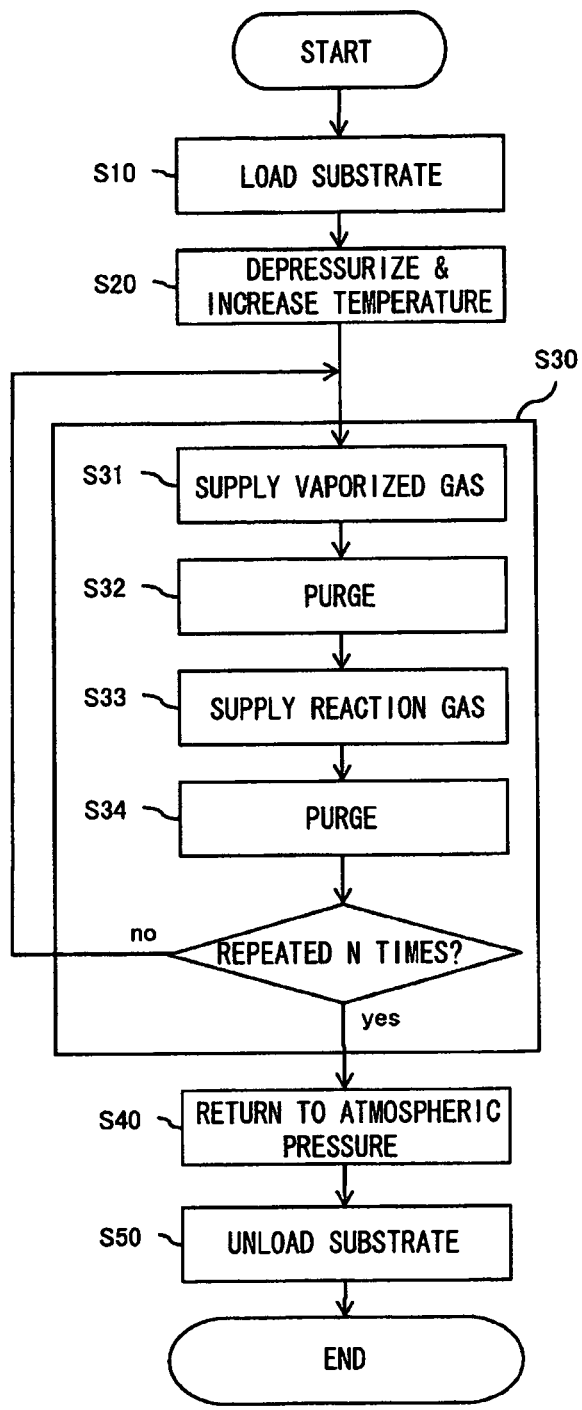
FIG. 9 is a flowchart for explaining a substrate processing process relevant to the first embodiment of the present invention.

FIG. 1 is a schematic view illustrating a substrate processing apparatus relevant to a first embodiment of the present invention. FIG. 2 is a vertical sectional view illustrating a process furnace provided in the substrate processing apparatus relevant to the first embodiment of the present invention. FIG. 3 illustrates a modification version of the process furnace of the substrate processing apparatus relevant to the first embodiment of the present invention. FIG. 5 is a cross sectional view illustrating a process tube provided in the substrate processing apparatus relevant to the first embodiment of the present invention. FIG. 6 is a perspective view illustrating an inner tube provided in the substrate processing apparatus relevant to the first embodiment of the present invention, in which gas exhaust outlets have a hole shape. FIG. 7 illustrates a modification version of the inner tube of the substrate processing apparatus relevant to the first embodiment of the present invention. FIG. 8 is a perspective view illustrating a boat provided in the substrate processing apparatus relevant to the first embodiment of the present invention. FIG. 9 is a flowchart for explaining a substrate processing process relevant to the first embodiment of the present invention. FIG. 11 is a gas supply sequence diagram of a film-forming process relevant to the first embodiment of the present invention. FIG. 13 is a table showing exemplary process conditions of a film-forming process relevant to the first embodiment of the present invention.

(1) Structure of Substrate Processing Apparatus

First, an exemplary structure of a substrate processing apparatus 101 relevant to an embodiment of the present invention will be described with reference to FIG. 1.

As shown in FIG. 1, the substrate processing apparatus 101 relevant to the current embodiment includes a housing 111. To carry wafers (substrates) 200 made of a material such as silicon into and out of the housing 111, a cassette 110 is used as a wafer carrier (substrate container) configured to accommodate a plurality of wafers 200. At the front side (right in the drawing) inside the housing 111, a cassette state (a substrate container stage) 114 is installed. The cassette 110 is configured such that the cassette 110 is placed on the cassette stage 114 and carried away from the cassette stage 114 to the outside of the housing 111 by an in-process carrying device (not shown).

The cassette 110 is placed on the cassette stage 114 by the in-process carrying device in a manner that wafers 200 are vertically positioned inside the cassette 110 and a wafer port of the cassette 110 faces upward. The cassette stage 114 is configured to rotate the cassette 110 by 90 degrees vertically toward the backside of the housing 111 so as to place the wafers 200 horizontally inside the cassette 110 and point the wafer port of the cassette 110 toward the backside of the housing 111.

Near the center part of the inside of the housing 111 in a front-rear direction, a cassette shelf (substrate container placement shelf) 105 is installed. The cassette shelf 105 is configured such that a plurality of cassettes 110 can be stored in multiple rows and columns. A transfer shelf 123 is installed at the cassette shelf 105 to place a cassette 110 to be carried by a wafer transfer mechanism 125 (described later). Above the cassette stage 114, a standby cassette shelf 107 is installed for storing cassettes 110 preliminarily.

Between the cassette stage 114 and the cassette shelf 105, a cassette carrying device (substrate container carrying device) 118 is installed. The cassette carrying device 118 includes a cassette elevator (substrate container elevating mechanism) 118a capable of moving upward and downward while holding a cassette 110, and a cassette carrying mechanism (substrate container carrying mechanism) 118b capable of moving horizontally while holding the cassette 110. By associated operations of the cassette elevator 118a and the cassette carrying mechanism 118b, the cassette 110 can be carried among the cassette stage 114, the cassette shelf 105, the standby shelf 107, and the transfer shelf 123.

At the rear side of the cassette shelf 105, the wafer transfer mechanism (substrate transfer mechanism) 125 is installed. The wafer transfer mechanism 125 includes a wafer transfer device (substrate transfer device) 125a capable of rotating or straightly moving a wafer 200 on a horizontal plane, and a wafer transfer device elevator (substrate transfer device elevator) 125b configured to move the wafer transfer device 125a upward and downward. The wafer transfer device 125a includes a tweezers (substrate transfer jig) 125c configured to hold a wafer 200 horizontally. By associated operations of the wafer transfer device 125a and the wafer transfer device elevator 125b, a wafer 200 can be picked up from an cassette 110 placed on the transfer shelf 123 and charged into a boat (substrate holder) 217 (described later), or the wafer 200 can be discharged from the boat 217 and put into the cassette 110 placed on the transfer shelf 123.

At the rear upper side of the housing 111, a process furnace 202 is installed. An opening (furnace port) is formed at the lower end of the process furnace 202, and a furnace port shutter (furnace port opening/closing mechanism) 147 is used to open and close the opening. The structure of the process furnace 202 will be described later.

At the lower side of the process furnace 202, a boat elevator (substrate holder elevating mechanism) 115 is installed as an elevating mechanism for moving the boat 217 upward/downward to load/unload the boat 217 into/from the inside of the process furnace 202. At an elevator base of the boat elevator 115, an arm 128 is installed as a connection tool. On the arm 128, the boat 217 is vertically supported, and a disk-shaped seal cap 219 is horizontally installed as a cover body for air-tightly sealing the lower end of the process furnace 202 when the boat elevator 115 is lifted.

The boat 217 includes a plurality of holding members and is configured to hold a plurality of wafers 200 (for example, about fifty to about one hundred fifty wafers) in a state where the wafers 200 are horizontally positioned and vertically stacked (arranged) in multiple stages with the centers of the wafers 200 being aligned. The structure of the boat 217 will be described later in more detail.

Above the cassette shelf 105, a cleaning unit 134a including a supply fan and a dust filter is installed. The cleaning unit 134a is configured to circulate clean air inside the housing 111 as a cleaned atmosphere.

In addition, at the left end side of the housing 111 opposite to the wafer transfer device elevator 125b and the boat elevator 115, a cleaning unit (not shown) including a supply fan and a dust filter is installed. Clean air drawn through the cleaning unit (not shown) flows around the wafer transfer device 125a and the boat 217, and then the clean air is sucked by an elevator device (not shown) and discharged to the outside of the housing 111.

(2) Operation of Substrate Processing Apparatus

Next, an operation of the substrate processing apparatus 101 relevant to the current embodiment will be explained.

First, a cassette 110 is placed on the cassette stage 114 by the in-process carrying device (not shown) in a manner that wafers 200 are vertically positioned inside the cassette 110 and the wafer port of the cassette 110 faces upward. Next, the cassette 110 is vertically rotated by the cassette stage 114 by 90 degrees toward the rear side of the housing 111. 0 the wafers 200 are horizontally positioned inside the cassette 110, and the wafer port of the cassette 110 faces the rear side of the housing 111.

By the cassette carrying device 118, the cassette 110 is automatically carried and temporarily stored to a predetermined position of the cassette shelf 105 or the standby shelf 107 and is then transferred to the transfer shelf 123 from the cassette shelf 105 or the standby shelf 107, or the cassette 110 is directly carried to the transfer shelf 123.

After the cassette 110 is transferred to the transfer shelf 123, a wafer 200 is picked up from the cassette 110 by the tweezers 125c of the wafer transfer device 125a through the wafer port of the cassette 110, and the wafer 200 is charged into the boat 217 disposed at the rear side of a transfer chamber by consecutive operations of the wafer transfer device 125a and the wafer transfer device elevator 125b. After the wafer transfer mechanism 125 charges the wafer 200 into the boat 217, the wafer transfer mechanism 125 returns to the cassette 110 for charging the next wafer 200 into the boat 217.

After a predetermined number of wafers 200 are charged in the boat 217, the lower end of the process furnace 202 closed by the furnace port shutter 147 is opened by moving the furnace port shutter 147. Next, the seal cap 219 is lifted by the boat elevator 115 so that the boat 217 where a group of wafers 200 are held can be loaded into the process furnace 202. After the boat 217 is loaded, a predetermined process is performed on the wafers 200 inside the process furnace 202. Such a process will be described later. After the process, the wafers 200 and the cassette 110 are carried to the outside of the housing 111 in a reverse order to the above-described order.

(3) Structure of Process Furnace

Next, the process furnace 202 relevant to an embodiment of the present invention will be explained with reference to FIG. 2, FIG. 3, and FIG. 5 to FIG. 8.

(Process Chamber)

The process furnace 202 relevant to an embodiment of the present invention includes a process tube 205 as a reaction tube, and a manifold 209. The manifold 209 includes an inner tube 204 configured to accommodate the boat 217 (described later), and an outer tube 203 configured to enclose the inner tube 204. Each of the inner tube 204 and the outer tube 203 is made of a heat-resistant nonmetallic material such as quartz ($SiO_2$) and silicon carbide (SiC), and has a cylindrical shape with a closed top side and an opened bottom side. The manifold 209 is made of a metallic material such as SUS (stainless steels prescribed in the Japanese Industrial standard) and has a cylindrical shape with opened top and bottom sides. The inner tube 204 and the outer tube 203 are vertically supported from their bottom sides by the manifold 209. The inner tube 204, the outer tube 203, and the manifold 209 are coaxial with one another. The bottom side (furnace port) of the manifold 209 is configured to be air-tightly closed by the seal cap 219 when the boat elevator 115 is lifted. Between the manifold 209 and the inner tube 204, a sealing member (not shown) such as an O-ring is installed to seal the inside of the inner tube 204 air-tightly. Inside the inner tube 204, a process chamber 201 is formed to process wafers 200.

Around the process tube 205 (the outer tube 203), a heater 207 is installed coaxially with the process tube 205 as a heating unit. The heater 207 has a cylindrical shape and is vertically installed in a manner that the heater 207 is supported on a heater base (not shown) used as a holding plate. At the outer lateral and top sides of the heater 207, an insulating material 207a is disposed.

(Substrate Holder)

The boat 217, which is a substrate holder configured to hold a plurality of wafers 200 in a state where the wafers 200 are stacked in a horizontal position, is inserted in the inner tube 204 (the process chamber 201) from the bottom side of the inner tube 204.

The boat 217, which is used as a substrate holder, includes a pair of upper and lower end plates 217c and 217d and a plurality of posts 217a (for example, three posts) vertically installed between the upper and lower end plates 217c and 217d. A plurality of holding grooves 217b are formed in each of the posts 217a in a manner that the grooves 217b are arranged at regular intervals in the length direction of the post 217a. The posts 217a are oriented such that the holding grooves 217b of the posts 217a face each other. By inserting peripheral parts of the wafers 200 into the holding grooves 217b that face each other, the wafers 200 (for example, about fifty to about one hundred fifty wafers) can be held in a state where the wafers 200 are substantially horizontal in orientation and are stacked at predetermined intervals (substrate pitch intervals).

The periphery of a region of the boat 217 lower than a region of the boat 217 where the wafers 200 are stacked (where the holding grooves 217b are formed) is enclosed by a cylindrical gas penetration preventing cylinder 217f. Top and bottom openings of the gas penetration preventing cylinder 217f are air-tightly closed by a cover plate 217e and the end plate 217d, respectively. At the lower side of a sidewall of the gas penetration preventing cylinder 217f, at least one vent hole 217g is formed.

Each of the end plate 217c, the end plate 217d, the post 217a, the gas penetration preventing cylinder 217f, and the cover plate 217e are made of a heat-resistant nonmetallic material such as quartz and silicon carbide.

In a state where the boat 217 is accommodated in the inner tube 204, at least a part of the gas penetration preventing cylinder 217f is located lower than a heating region of the heater 207. That is, when the inside of the process tube 205 is heated by the heater 207, the temperature of at least a part of a lateral side of the gas penetration preventing cylinder 217f is lower than the temperature of a region where the wafers 200 are stacked.

Furthermore, in a state where the boat 217 is accommodated in the inner tube 204, the distance between the upper end plate 217c and a top plate of the inner tube 204 is shorter than, for example, the distance (stack pitch) between the stacked wafers 200. That is, the conductance of a space between the upper end plate 217c and the top plate of the inner tube 204 is smaller than the conductance of a region where the wafers 200 are stacked, and a gas flow is not easily created at the space between the upper end plate 217c and the top plate of the inner tube 204.

Furthermore, in a state where the boat 217 is accommodated in the inner tube 204, the distance between the inner wall of the inner tube 204 and the gas penetration preventing cylinder 217f is shorter than, for example, the distance between the stacked wafers 200. That is, the conductance of a space between the inner wall of the inner tube 204 and the gas penetration preventing cylinder 217f is smaller than the conductance of a region where the wafers 200 are stacked, and a gas flow is not easily created at the space between the inner wall of the inner tube 204 and the gas penetration preventing cylinder 217f.

The lower side of the boat 217 is supported by a rotation shaft 255. The rotation shaft 255 is installed through a center part of the seal cap 219. At the lower side of the seal cap 219, a rotary mechanism 267 is installed to rotate the rotation shaft 255. By rotating the rotation shaft 255 using the rotary mechanism 267, the boat 217 in which a plurality of wafers 200 are charged can be rotated inside the inner tube 204.

The gas penetration preventing cylinder 217f relevant to the present invention is not limited to the above-described structure.

For example, as shown in FIG. 3, by previously evacuating the inside of the gas penetration preventing cylinder 217f when the top and bottom openings of the gas penetration preventing cylinder 217f are air-tightly closed by the cover plate 217e and the end plate 217d, the gas penetration preventing cylinder 217f can be configured as a vacuum cap. In this case, a vent hole 217g is not formed in any of the sidewall of the gas penetration preventing cylinder 217f, the cover plate 217e, and the end plate 217d.

(Gas Nozzle)

At the sidewall of the inner tube 204, a preliminary chamber 201a is installed along the stacked direction (vertical direction) of the wafers 200 in a manner that the preliminary chamber 201a protrudes outward from the sidewall of the inner tube 204 in the radial direction of the inner tube 204 (toward the sidewall of the outer tube 203). A barrier wall is not installed between the preliminary chamber 201a and the process chamber 201, and the inside of the preliminary chamber 201a communicates with the inside of the process chamber 201, such that gas can flow between the insides of the preliminary chamber 201a and the process chamber 201.

Inside the preliminary chamber 201a, a vaporized gas nozzle 233a and a reaction gas nozzle 233b are installed along the circumferential direction of the inner tube 204 as a first gas nozzle and a second gas nozzle, respectively. Each of the vaporized gas nozzle 233a and the reaction gas nozzle 233b has an L-shape with vertical and horizontal parts. The vertical parts of the vaporized gas nozzle 233a and the reaction gas nozzle 233b are installed (extended) inside the preliminary chamber 201a along the stacked direction of the wafers 200. The horizontal parts of the vaporized gas nozzle 233a and the reaction gas nozzle 233b are installed through the sidewall of the manifold 209.

At lateral surfaces of the vertical parts of the vaporized gas nozzle 233a and the reaction gas nozzle 233b, a plurality of vaporized gas injection holes 248a and a plurality of reaction gas injection holes 248b are formed along the stacked direction of the wafers 200, respectively. Therefore, the vaporized gas injection holes 248a and the reaction gas injection holes 248b are located at positions spaced outward from the sidewall of the inner tube 204 in the radial direction of the inner tube 204. The vaporized gas injection holes 248a and the reaction gas injection holes 248b are formed at positions (heights) corresponding to the plurality of wafers 200, respectively. The sizes of the vaporized gas injection holes 248a and the reaction gas injection holes 248b can be properly adjusted to obtain adequate gas flowrate and velocity distributions inside the inner tube 204. For example, the sizes of the vaporized gas injection holes 248a and the reaction gas injection holes 248b may be adjusted to be uniform or gradually increased from the lower side to the upper side.

The present invention is not limited to the case where the preliminary chamber 201a is installed at the inner tube 204. For example, the preliminary chamber 201a may not be installed at the inner tube 204, and the vaporized gas nozzle 233a and the reaction gas nozzle 233b may be directly installed inside the inner tube 204.

(Vaporized Gas Supply Unit)

To a horizontal end (upstream side) of the vaporized gas nozzle 233a which protrudes from the sidewall of the manifold 209, a vaporized gas supply pipe 240a is connected. A vaporizer 260 is connected to an upstream side of the vaporized gas supply pipe 240a for vaporizing a liquid source to generate a vaporized gas as a first source gas. An on-off valve 241a is installed at the vaporized gas supply pipe 240a. Vaporized gas can be supplied from the vaporizer 260 to the inside of the inner tube 204 through the vaporized gas nozzle 233a by opening the on-off valve 241a.

Downstream sides of a liquid source supply pipe 240c and a carrier gas supply pipe 240f are connected to the upstream side of the vaporizer 260 for supplying a liquid source and a carrier gas to the inside of the vaporizer 260, respectively.

A liquid source supply tank 266, in which a liquid source such as tetrakis-ethylmethylaminozirconium (TEMAZr) is stored, is connected to the upstream side of the liquid source supply pipe 240c. The upstream side of the liquid source supply pipe 240c is placed in the liquid source stored in the liquid source supply tank 266. An on-off valve 243c, a liquid mass flow controller (LMFC) 242c, and an on-off valve 241c are installed at the liquid source supply pipe 240c sequentially from the upstream side of the liquid source supply pipe 240c. A downstream side of a pressurizing gas supply pipe 240d is connected to the top side of the liquid source supply tank 266 for supplying inert gas (pressurizing gas) such as $N_2$ gas. The upstream side of the pressurizing gas supply pipe 240d is connected to a pressurizing gas supply source (not shown) that supplies inert gas such as He gas as a pressurizing gas. At the pressurizing gas supply pipe 240d, an on-off valve 241d is installed. By opening the on-off valve 241d, a pressuring gas can be supplied to the inside of the liquid source supply tank 266, and by opening the on-off valves 243c and 241c, a liquid source can be pressure-fed (supplied) from the liquid source supply tank 266 to the vaporizer 260 for generating a vaporized gas inside the liquid source supply tank 266. The flowrate of the liquid source supplied to the vaporizer 260 (that is, the flowrate of a vaporized gas generated in the vaporizer 260 and supplied to the inside of the inner tube 204) can be controlled by using the LMFC 242c.

A carrier gas supply source (not shown) is connected to the upstream side of the carrier gas supply pipe 240f for supplying inert gas (carrier gas) such as $N_2$ gas. A mass flow controller (MFC) 242f and an on-off valve 241f are sequentially installed from the upstream side of the carrier gas supply pipe 240f. By opening the on-off valve 241f and the on-off valve 241a, a carrier gas can be supplied to the vaporizer 260, and a gas mixture of the carrier gas and vaporized gas generated in the vaporizer 260 can be supplied to the inside of the inner tube 204 through the vaporized gas supply pipe 240a and the vaporized gas nozzle 233a. By supplying carrier gas to the inside of the vaporizer 260, discharge of vaporized gas from the vaporizer 260, and supply of vaporized gas to the inside of the inner tube 204 can be facilitated. The flowrate of carrier gas supplied to the inside of the vaporizer 260 (that is, the flowrate of carrier gas supplied to the inside of the inner tube 204) can be controlled by using the MFC 242f.

A vaporized gas supply unit, which supplies vaporized gas (first source gas) to the inside of the inner tube 204 through the vaporized gas nozzle 233a, is constituted mainly by the vaporized gas supply pipe 240a, the vaporizer 260, the on-off valve 241a, the liquid source supply pipe 240c, the on-off valve 243c, the LMFC 242c, the on-off valve 241c, the liquid source supply tank 266, the pressurizing gas supply pipe 240d, the pressurizing gas supply source (not shown), the on-off valve 241d, the carrier gas supply pipe 240f, the carrier gas supply source (not shown), the MFC 242f, and the on-off valve 241f.

(Reaction Gas Supply Unit)

To a horizontal end (upstream side) of the reaction gas nozzle 233b which protrudes from the sidewall of the manifold 209, a reaction gas supply pipe 240b is connected. An ozonizer 270 is connected to an upstream side of the reaction gas supply pipe 240b for generating ozone ($O_3$) gas (an oxidizer) as a second source gas. An MFC 242b and an on-off valve 241b are sequentially installed from the upstream side of the reaction gas supply pipe 240b. The downstream side of an oxygen gas supply pipe 240e is connected to the ozonizer 270. The upstream side of the oxygen gas supply pipe 240e is connected to an oxygen gas supply source (not shown) that supplies oxygen ($O_2$) gas. An on-off valve 241e is installed at the oxygen gas supply pipe 240e. By opening the on-off valve 241e, oxygen gas can be supplied to the ozonizer 270, and by opening the on-off valve 241b, ozone gas generated in the ozonizer 270 can be supplied to the inside of the inner tube 204 through the reaction gas supply pipe 240b. The flowrate of ozone gas supplied to the inside of the inner tube 204 can be controlled by using the MFC 242b.

Mainly by the reaction gas supply pipe 240b, the ozonizer 270, the MFC 242b, the oxygen gas supply pipe 240e, the oxygen gas supply source (not shown), and the on-off valve 241e, a reaction gas supply unit is constituted to supply ozone gas (second source gas) to the inside of the inner tube 204 through the reaction gas nozzle 233b.

(Vent Pipe)

The upstream side of a vaporized gas vent pipe 240i is connected to the vaporized gas supply pipe 240a between the vaporizer 260 and the on-off valve 241a. The downstream side of the vaporized gas vent pipe 240i is connected to the downstream side of an exhaust pipe 231 (described later) between an automatic pressure control (APC) valve 231a (described later) and a vacuum pump 231b (described later). An on-off valve 241i is installed at the vaporized gas vent pipe 240i. By closing the on-off valve 241a and opening the on-off valve 241i, supply of vaporized gas to the inside of the inner tube 204 can be interrupted while continuing generation of vaporized gas inside the vaporizer 260. Since it takes a predetermined time to generate vaporized gas stably, it is configured such that switching between supply and non-supply of vaporized gas to the inside of the inner tube 204 can be carried out within a very short time by switching the on-off valve 241a and the on-off valve 241i.

Similarly, the upstream side of a reaction gas vent pipe 240j is connected to the reaction gas supply pipe 240b between the ozonizer 270 and the MFC 242b. The downstream side of the reaction gas vent pipe 240j is connected to the downstream side of the exhaust pipe 231 (between the APC valve 231a (described later) and the vacuum pump 231b (described later)). An on-off valve 241j and an ozone elimination device (not shown) are sequentially installed from the upstream side of the reaction gas vent pipe 240j. By closing the on-off valve 241b and opening the on-off valve 241j, supply of ozone gas to the inside of the inner tube 204 can be interrupted while continuing generation of ozone gas inside the ozonizer 270. Since it takes a predetermined time to generate ozone gas stably, it is configured such that switching between supply and non-supply of ozone gas to the inside of the inner tube 204 can be carried out within a very short time by switching the on-off valve 241b and the on-off valve 241j.

(Inert Gas Supply Pipe)

The downstream side of a first inert gas supply pipe 240g is connected to the downstream side of the on-off valve 241a of the vaporized gas supply pipe 240a. An inert gas supply source (not shown) configured to supply inert gas such as $N_2$ gas, an MFC 242g, and an on-off valve 241g are sequentially installed from the upstream side of the first inert gas supply pipe 240g. Similarly, the downstream side of a second inert gas supply pipe 240h is connected to the downstream side of the on-off valve 241b of the reaction gas supply pipe 240b. An inert gas supply source (not shown) configured to supply inert gas such as $N_2$ gas, an MFC 242h, and an on-off valve 241h are sequentially installed from the upstream side of the second inert gas supply pipe 240h.

Inert gas supplied through the first inert gas supply pipe 240g and the second inert gas supply pipe 240h is used as a carrier gas or purge gas.

For example, by closing the on-off valve 241i and opening the on-off valve 241a and the on-off valve 241g, gas (a gas mixture of vaporized gas and carrier gas) output from the vaporizer 260 can be supplied to the inside of the inner tube 204 while diluting the gas output from the vaporizer 260 with inert gas (carrier gas) supplied from the first inert gas supply pipe 240g. Similarly, by closing the on-off valve 241j and opening the on-off valve 241b and the on-off valve 241h, reaction gas output from the ozonizer 270 can be supplied to the inside of the inner tube 204 while diluting the reaction gas with inert gas (carrier gas) supplied from the second inert gas supply pipe 240h.

In addition, gas dilution can be performed in the preliminary chamber 201a. That is, by closing the on-off valve 241i and opening the on-off valve 241a and the on-off valve 241h, gas (a gas mixture of vaporized gas and carrier gas) output from the vaporizer 260 can be supplied to the inside of the inner tube 204 while diluting the gas in the preliminary chamber 201a with inert gas (carrier gas) supplied from the second inert gas supply pipe 240h. Similarly, by closing the on-off valve 241j and opening the on-off valve 241b and the on-off valve 241g, ozone gas output from the ozonizer 270 can be supplied to the inside of the inner tube 204 while diluting the ozone gas in the preliminary chamber 201a with inert gas (carrier gas) supplied from the first inert gas supply pipe 240g.

In addition, while continuing generation of vaporized gas in the vaporizer 260, supply of vaporized gas to the inside of the inner tube 204 can be interrupted by closing the on-off valve 241a and opening the on-off valve 241i, and at the same time, inert gas (purge gas) can be supplied from the first inert gas supply pipe 240g and the second inert gas supply pipe 240h to the inside of the inner tube 204 by opening the on-off valve 241g and the on-off valve 241h. Similarly, while continuing generation of ozone gas in the ozonizer 270, supply of ozone gas to the inside of the inner tube 204 can be interrupted by closing the on-off valve 241b and opening the on-off valve 241j, and at the same time, inert gas (purge gas) can be supplied from the first inert gas supply pipe 240g and the second inert gas supply pipe 240h to the inside of the inner tube 204 by opening the on-off valve 241g and the on-off valve 241h. In the way, by supplying inert gas (purge gas) to the inside of the inner tube 204, discharge of vaporized gas or ozone gas from the inside of the inner tube 204 can be facilitated.

(Gas Exhaust Part and Gas Exhaust Outlets)

At the sidewall of the inner tube 204, a gas exhaust part 204b is formed along a stacked direction of wafers 200 as part of the sidewall of the inner tube 204. The gas exhaust part 204b is formed at a position facing the vaporized gas nozzle 233a and the reaction gas nozzle 233b with the wafers 200 being disposed therebetween (that is, at a position about 180-degree opposite to the vaporized gas nozzle 233a and the reaction gas nozzle 233b). Furthermore, in the circumferential direction of the inner tube 204, the width of the gas exhaust part 204b is greater than the distance between the vaporized gas nozzle 233a and the reaction gas nozzle 233b.

At the sidewall of the gas exhaust part 204b, gas exhaust outlets 204a are formed. The gas exhaust outlets 204a are formed at positions facing the vaporized gas nozzle 233a and the reaction gas nozzle 233b with the wafers 200 being disposed therebetween (that is, at positions about 180-degree opposite to the vaporized gas nozzle 233a and the reaction gas nozzle 233b). The gas exhaust outlets 204a relevant to the current embodiment have a hole shape and are formed at positions (heights) corresponding to the wafers 200, respectively. Therefore, a space 203a formed between the outer tube 203 and the inner tube 204 communicates with the inside of the inner tube 204 through the gas exhaust outlets 204a. The diameters of the gas exhaust outlets 204a can be properly adjusted to obtain adequate gas flowrate and velocity distributions inside the inner tube 204. For example, the diameters of the gas exhaust outlets 204a may be adjusted to be uniform or gradually increased from the lower side to the upper side.

The shape of the gas exhaust outlets 204a relevant to the present invention is not limited to the hole shape shown in FIG. 6, and the positions of the gas exhaust outlets 204a are not limited to positions (heights) corresponding to respective wafers 200. For example, as shown in FIG. 7, a slit may be formed along the stacked direction of wafers 200 as a gas exhaust outlet 204a. The width of the slit may be properly adjusted to obtain adequate gas flowrate and velocity distributions inside the inner tube 204. For example, the width of the slit may be adjusted to be uniform or gradually decreased from the lower side to the upper side.

In addition, as shown in the cross sectional view of the process tube 205 of FIG. 5, the sidewall of the inner tube 204 relevant to the current embodiment is configured such that the distance L2 between the outer edge of a wafer 200 accommodated in the inner tube 204 and the gas exhaust outlet 204a is greater than the distance L1 between the outer edge of the wafer 200 accommodated in the inner tube 204 and the vaporized gas injection hole 248a. Furthermore, the sidewall of the inner tube 204 relevant to the current embodiment is configured such that the distance L2 between the outer edge of the wafer 200 accommodated in the inner tube 204 and the gas exhaust outlet 204a is greater than the distance L1 between the outer edge of the wafer 200 accommodated in the inner tube 204 and the reaction gas injection hole 248b. Furthermore, in the circumferential direction of the inner tube 204 relevant to the current embodiment, the width of the gas exhaust part 204b is greater than the distance between the vaporized gas nozzle 233a and the reaction gas nozzle 233b. However, the present invention is not limited to the above-described structures.

(Exhaust Unit)

The exhaust pipe 231 is connected to the sidewall of the manifold 209. A pressure sensor 245 used as a pressure detector, the APC valve 231a used as a pressure regulator, the vacuum pump 231b used as a vacuum exhaust device, and a toxicant removing machine 231c configured to remove toxic substances from exhaust gas are sequentially installed from the upstream side of the exhaust pipe 231. By controlling the APC valve 231a while operating the vacuum pump 231b, the inside pressure of the inner tube 204 can be adjusted to a desired level. An exhaust unit is constituted mainly by the exhaust pipe 231, the pressure sensor 245, the APC valve 231a, the vacuum pump 231b, and the toxicant removing machine 231c.

As described above, the space 203a formed between the outer tube 203 and the inner tube 204 communicates with the inside space of the inner tube 204 through the gas exhaust outlets 204a. Therefore, by exhausting the space 203a formed between the outer tube 203 and the inner tube 204 through the exhaust unit while supplying gas to the inside of the inner tube 204 through the vaporized gas nozzle 233a or the reaction gas nozzle 233b, horizontal gas streams 10 can be produced inside the inner tube 204 in a direction from the vaporized gas injection holes 248a or the reaction gas injection holes 248b to the gas exhaust outlets 204a.

(Controller)

The controller 280 used as a control unit is connected to devices such as the heater 207, the APC valve 231a, the vacuum pump 231b, the rotary mechanism 267, the boat elevator 115, the on-off valves 241a, 241b, 241c, 241d, 241e, 241f, 241g, 241h, 241i, and 241j, the LMFC 242c, and the MFCs 242b, 242f, 242g, and 242h. The controller 280 controls the temperature adjustment operation of the heater 207; the opening/closing and pressure adjustment operations of the APC valve 231a; the operation of the vacuum pump 231b; the rotation velocity adjustment operation of the rotary mechanism 267; the elevating operation of the boat elevator 115; the opening/closing operations of the on-off valves 241a, 241b, 241c, 241d, 241e, 241f, 241g, 241h, 241i, and 241j; and the flowrate adjust operations of the LMFC 242c and the MFCs 242b, 242f, 242g, and 242h.

The controller 280 controls the gas supply units and the exhaust unit to supply at least two kinds of gases to the inside of the inner tube 204 by turns while keeping the gases from mixing together. For this end, when gas is supplied to the inside of the inner tube 204, the controller 280 controls the gas supply units and the exhaust unit to keep the inside pressure of the inner tube 204 in the range from 10 Pa to 700 Pa. Specifically, when vaporized gas is supplied to the inside of the inner tube 204, the controller 280 controls the vaporized gas supply unit and the exhaust unit to keep the inside pressure of the inner tube 204, for example, in the range from 10 Pa to 700 Pa (preferably, 250 Pa). In addition, when reaction gas is supplied to the inside of the inner tube 204, the controller 280 controls the reaction gas supply unit and the exhaust unit to keep the inside pressure of the inner tube 204, for example, in the range from 10 Pa to 300 Pa (preferably, 100 Pa).

(4) Substrate Processing Process

Next, as an embodiment of the present invention, a substrate processing process will be explained with reference to FIG. 9 and FIG. 11. In the current embodiment, TEMAZr gas (vaporized gas) is used as a first source gas, and ozone gas (reaction gas) is used as a second source gas, so as to perform a method of forming a high-k (high dielectric constant) film on a wafer 200, as one of semiconductor device manufacturing processes, by using an atomic layer deposition (ALD) method which is a kind of chemical vapor deposition (CVD)

method. In the following description, the controller 280 controls parts of the substrate processing apparatus 101.

(Substrate Loading Operation S10)

First, a plurality of wafers 200 are charged into the boat 217. Next, the boat 217, in which the plurality of wafers 200 are horizontally held in a stacked state, is lifted by the boat elevator 115 to load the boat 217 into the inner tube 204 (boat loading). In this state, the lower opening (furnace port) of the manifold 209 is sealed by the seal cap 219 with the O-ring 220b being disposed between the seal cap 219 and the manifold 209. In the substrate loading operation S10, it is preferable that purge gas is continuously supplied to the inside of the inner tube 204 by opening the on-off valve 241g and the on-off valve 241h.

(Depressurizing and Temperature Increasing Operation S20)

Next, the on-off valve 241g and the on-off valve 241h are closed, and the inside of the inner tube 204 is exhausted by using the vacuum pump 231b so as to adjust the pressure of the inside of the inner tube 204 (the inside of the process chamber 201) to a desired process pressure (vacuum degree). At this time, the opened area of the APC valve 231a is feedback controlled based on temperature information measured by using the pressure sensor 245. In addition, to keep the surfaces of the wafers 200 at a desired temperature (process temperature), power supply to the heater 207 is controlled. At this time, power supply to the heater 207 is feedback controlled based on temperature information measured by using a temperature sensor. Thereafter, the boat 217 and the wafers 200 are rotated by using the rotary mechanism 267.

Exemplary conditions at the end of the depressurizing and temperature increasing operation S20 are follows.

Process pressure: 10 Pa to 1000 Pa, preferably 50 Pa

Process temperature: 180° C. to 250° C., preferably 220° C.

(Film Forming Operation S30)

Next, a cycle of a vaporized gas supply operation S31 to a purge operation S34 (described later) is repeated for a predetermined number of times to form high-k films ($ZrO_2$ film) on the wafers 200 to a desired thickness. FIG. 11 shows exemplary gas supply sequences of the vaporized gas supply operation S31 to purge operation S34.

(Vaporized Gas Supply Operation S31)

First, the on-off valve 241d is opened to supply pressurizing gas to the inside of the liquid source supply tank 266. Next, the on-off valve 243c and the on-off valve 241c are opened to press (supply) a liquid source such as TEMAZr from the inside of the liquid source supply tank 266 to the inside of the vaporizer 260 so as to generate TEMAZr gas (vaporized gas) by vaporizing the liquid TEMAZr. In addition, the on-off valve 241f is opened to supply $N_2$ gas (carrier gas) to the inside of the vaporizer 260. Until the TEMAZr gas is stably generated, the on-off valve 241a is closed, and the on-off valve 241i is opened, so as to discharge a gas mixture of TEMAZr gas and $N_2$ gas through the vaporized gas vent pipe 240i.

After TEMAZr gas is stably generated, the on-off valve 241i is closed, and the on-off valve 241a is opened, so as to supply a gas mixture of TEMAZr gas and $N_2$ gas to the inside of the inner tube 204 through the vaporized gas nozzle 233a. At this time, the on-off valve 241g is opened so as to supply the gas mixture from the vaporizer 260 to the inside of the inner tube 204 while diluting the gas mixture with $N_2$ gas (carrier gas) supplied through the first inert gas supply pipe 240g. At this time, for example, the flowrate of TEMAZr gas may be 0.35 g/min; the flowrate of $N_2$ gas supplied through the carrier gas supply pipe 240f may be 1 slm; the flowrate of $N_2$ gas supplied through the first inert gas supply pipe 240g may be 8 slm; and the flowrate of $N_2$ gas supplied through the second inert gas supply pipe 240h may be 2 slm.

Horizontal gas streams 10 are formed in a direction from the vaporized gas injection holes 248a to the gas exhaust outlets 204a by the gas mixture supplied to the inside of the inner tube 204 through the vaporized gas nozzle 233a, and the horizontal gas streams 10 are discharged through the exhaust pipe 231. At this time, TEMAZr gas is supplied to the surfaces of the stacked wafers 200, and thus molecules of the TEMAZr gas are adsorbed into the surfaces of the wafers 200.

After performing the process continuously for a predetermined time (for example, 120 seconds), the on-off valve 241a is closed, and the on-off valve 241i is opened, so as to interrupt supply of TEMAZr gas to the inside of the inner tube 204 while continuously generating the TEMAZr gas. In a state where the on-off valve 241f is opened, supply of $N_2$ gas to the vaporizer 260 is continued.

(Purge Operation S32)

Next, the on-off valve 241g and the on-off valve 241h are opened to supply $N_2$ (purge gas) to the inside of the inner tube 204. At this time, for example, the flowrate of $N_2$ gas supplied from the first inert gas supply pipe 240g may be 5 slm, and the flowrate of $N_2$ gas supplied from the second inert gas supply pipe 240h may be 4 slm. Owing to this, discharge of TEMAZr gas from the inside of the inner tube 204 is facilitated. If the inside atmosphere of the inner tube 204 is replaced with $N_2$ gas after a predetermined time (for example, 20 seconds), the on-off valve 241g and the on-off valve 241h are closed to interrupt supply of $N_2$ gas to the inside of the inner tube 204. Then, the inside of the inner tube 204 is exhausted for a predetermined time (for example, 20 seconds).

(Reaction Gas Supply Operation S33)

Next, the on-off valve 241e is opened to supply oxygen gas to the ozonizer 270 so as to generate ozone gas (an oxidizer) as a reaction gas. Until ozone gas is stably generated, the on-off valve 241b is closed, and the on-off valve 241j is opened, in order to discharge ozone gas through the reaction gas vent pipe 240j.

After ozone gas is stably generated, the on-off valve 241j is closed, and the on-off valve 241b is opened, to supply ozone gas to the inside of the inner tube 204 through the reaction gas nozzle 233b. At this time, the on-off valve 241g is opened so that the ozone gas can be supplied to the inside of the inner tube 204 through the reaction gas nozzle 233b while being diluted at the preliminary chamber 201a with $N_2$ gas (carrier gas) supplied through the first inert gas supply pipe 240g. At this time, for example, the flowrate of ozone gas may be 6 slm, and the flowrate of $N_2$ gas supplied through the first inert gas supply pipe 240g may be 2 slm.

By ozone gas supplied to the inside of the inner tube 204 through the reaction gas nozzle 233b, horizontal gas streams 10 are formed in a direction from the reaction gas injection holes 248b to the gas exhaust outlets 204a, and the horizontal gas streams 10 are discharged through the exhaust pipe 231. In this way, ozone gas is supplied to the surfaces of the stacked wafers 200 and chemically reacts with molecules of TEMAZr gas adsorbed in the surfaces of the wafers 200, so that high-k films ($ZrO_2$ film) each constituted by one to several atomic layers can be formed on the wafers 200.

After reaction gas is supplied for a predetermined time, the on-off valve 241b is closed, and the on-off valve 241j is opened, so as to interrupt supply of reaction gas to the inside of the inner tube 204 while continuing generation of ozone gas.

(Purge Operation S34)

Next, the on-off valve 241g and the on-off valve 241h are opened to supply $N_2$ gas (purge gas) to the inside of the inner tube 204. At this time, for example, the flowrate of $N_2$ gas supplied through the first inert gas supply pipe 240g may be 4 slm, and the flowrate of $N_2$ gas supplied through the second inert gas supply pipe 240h may be 4 slm. Therefore, discharge of ozone gas and reaction gas from the inside of the inner tube 204 is facilitated. If the inside atmosphere of the inner tube 204 is replaced with $N_2$ gas after a predetermined time (for example, 10 seconds), the on-off valve 241g and the on-off valve 241h are closed to interrupt supply of $N_2$ gas to the inside of the inner tube 204. Thereafter, the inside of the inner tube 204 is exhausted for a predetermined time (for example, 15 seconds).

Then, the vaporized gas supply operation S31 to the purge operation S34 are bounded as a cycle, and the cycle is repeated for a predetermined number of times, to supply TEMAZr gas and ozone gas to the inside of the inner tube 204 by turns without mixing, so as to form high-k films ($ZrO_2$) on the wafers 200 to a desired thickness (film forming operation S30). The process conditions of the above-described processes are not limited to the above-mentioned values or ranges. For example, the process conditions shown in FIG. 13 can be used.

<Conditions of Vaporized Gas Supply Operation S31>
Process pressure: 10 Pa to 700 Pa, preferably 250 Pa
TEMAZr gas flowrate: 0.01 g/min to 0.35 g/min, preferably 0.3 g/min
$N_2$ gas flowrate: 0.1 slm to 1.5 slm, preferably 1.0 slm
Process temperature: 180° C. to 250° C., preferably 220° C.
Process time: 30 seconds to 180 seconds, preferably 120 seconds <Conditions of Purge Operation S32>
Process pressure: 10 Pa to 100 Pa, preferably 70 Pa
$N_2$ gas flowrate: 0.5 slm to 20 slm, preferably 12 slm
Process temperature: 180° C. to 250° C., preferably 220° C.
Process time: 30 seconds to 150 seconds, preferably 60 seconds <Conditions of Reaction Gas Supply Operation S33>
Process pressure: 10 Pa to 300 Pa, preferably 100 Pa
Ozone gas flowrate: 6 slm to 20 slm, preferably 17 slm
$N_2$ gas flowrate: 0 slm to 2 slm, preferably 0.5 slm
Process temperature: 180° C. to 250° C., preferably 220° C.
Process time: 10 seconds to 300 seconds, preferably 120 seconds <Conditions of Purge Operation S34>
Process pressure: 10 Pa to 100 Pa, preferably 70 Pa
$N_2$ gas flowrate: 0.5 slm to 20 slm, preferably 12 slm
Process temperature: 180° C. to 250° C., preferably 220° C.
Process time: 10 seconds to 90 seconds, preferably 60 seconds (Atmospheric Pressure Return Operation S40, Substrate Unloading Operation S50)

After the high-k films ($ZrO_2$) having a desired thickness are formed on the wafers 200, the opened area of the APC valve 231a is reduced, and the on-off valve 241g and the on-off valve 241h are opened to supply purge gas to the inside of the inner tube 204 until the inside pressure of the process tube 205 (the inside pressures of the inner tube 204 and the outer tube 203) becomes atmospheric pressure (S40). Thereafter, the wafers 200 on which films are formed are unloaded from the inside of the inner tube 204 in the reverse order to that of the substrate loading operation S10 (S50). In the substrate unloading operation S50, it is preferable that the on-off valve 241g and the on-off valve 241h be opened for continuing supply of purge gas.

(5) Effects Relevant to the Current Embodiment

According to the current embodiment, one or more effects can be attained as follows.

(a) According to the current embodiment, in the boat 217, a region lower than a region where wafers 200 are stacked is surrounded by the gas penetration preventing cylinder 217f having a cylindrical shape. Therefore, gas supplied to inside of the inner tube 204 is allowed to flow in the region of the boat 217 where the wafers 200 are stacked but is restrained from flowing in a region lower than the region. That is, supply of TEMAZr gas or ozone gas can be facilitated between wafers 200 held at lower positions than the other wafers 200 held in the boat 217, and thus it can be prevented that the velocity of supplied TEMAZr gas or ozone gas is lowered at the center parts of the lower wafers 200, thereby improving the uniformity of substrate processing quality in the surfaces of the wafers 200 and between the wafers 200.

Figure 17:
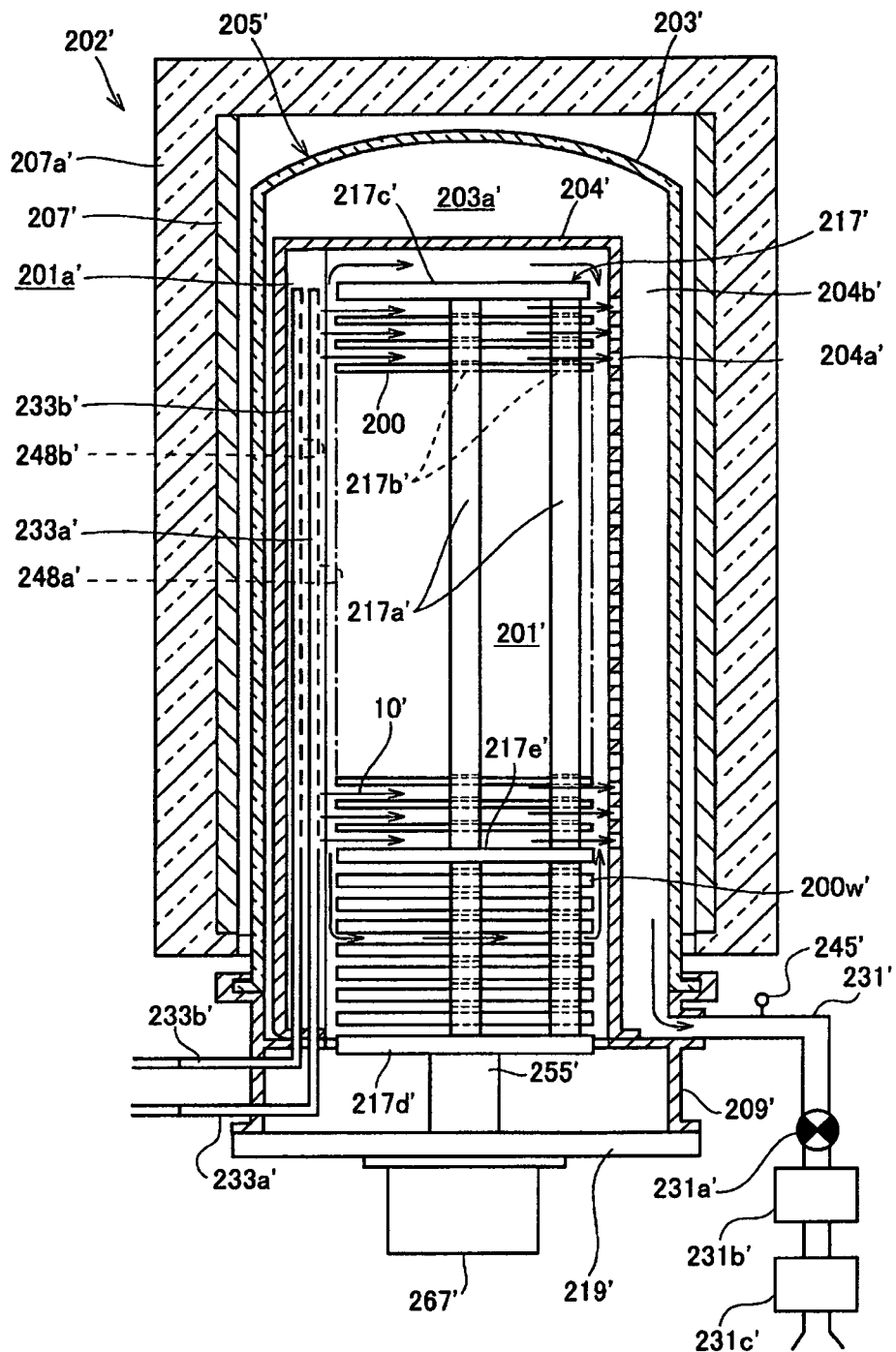
FIG. 17 is a vertical sectional view illustrating a process furnace provided in a conventional substrate processing apparatus.

For reference, the structure of a process furnace 202' of a conventional substrate processing apparatus is illustrated in FIG. 17. Referring to FIG. 17, in a boat 217' of the conventional substrate processing apparatus, a plurality of disk-shaped insulation plates 217g' made of a material such as quartz or silicon carbide are horizontally oriented and stacked in a region lower than stacked wafers 200. That is, in the boat 217' of the conventional substrate processing apparatus, a gas penetration preventing cylinder 217f is not installed in the region lower than the stacked wafers 200. Therefore, gas supplied to the inside of an inner tube 204' may not flow between the wafers 200 but flow in the region of the boat 217' lower than the wafers 200, so that the velocity of gas supplied to lower wafers 200 can be lowered (the amount of supplied gas can be reduced) to degrade the uniformity of substrate processing quality in the surfaces of the wafers 200 and between the wafers 200.

(b) According to the current embodiment, in a state where the boat 217 is accommodated in the inner tube 204, the distance between the upper end plate 217c of the boat 217 and the top plate of the inner tube 204 is smaller than the distance (stack pitch) between stacked wafers 200. That is, the conductance of the space between the upper end plate 217c and the top plate of the inner tube 204 is smaller than the conductance of a region where the wafers 200 are stacked, and a gas flow is not easily created at the space between the upper end plate 217c and the top plate of the inner tube 204. Therefore, TEMAZr gas or ozone gas supplied to the inside of the inner tube 204 can be restrained from flowing between the upper end plate 217c and the top plate of the inner tube 204 instead of flowing between the wafers 200, and thus supply of TEMAZr gas or ozone gas to gaps between wafers 200 held at high positions can be facilitated. Therefore, it can be prevented that the velocity of supplied TEMAZr gas or ozone gas is lowered at the center parts of the highly-positioned wafers 200, and thus the uniformity of substrate processing quality can be improved in the surfaces of the wafer 200 and between the wafers 200.

However, in the case of the conventional substrate processing apparatus, as shown in FIG. 17, the distance between an upper end plate 217c' of the boat 217' and the top plate of the inner tube 204' is greater than the distance (stack pitch) between the stacked wafers 200. That is, the conductance of the space between the upper end plate 217c' and the top plate of the inner tube 204' is greater than the conductance of a region where the wafers 200 are stacked. Therefore, instead of flowing between the wafers 200, gas supplied to the inside of the inner tube 204' can flow between the upper end plate 217c' and the top plate of the inner tube 204', and thus the velocity of gas supplied to upper wafers 200 can be lowered (the amount of supplied gas can be reduced) to degrade the uniformity of substrate processing quality in the surfaces of the wafers 200 and between the wafers 200.

(c) According to the current embodiment, in a state where the boat 217 is accommodated in the inner tube 204, the distance between the inner wall of the inner tube 204 and the gas penetration preventing cylinder 217f is shorter than the distance between stacked wafers 200. That is, the conductance of the space between the inner wall of the inner tube 204 and the gas penetration preventing cylinder 217f is smaller than the conductance of a region where the wafers 200 are stacked, and thus a gas flow is not easily created at the space between the inner wall of the inner tube 204 and the gas penetration preventing cylinder 217f. Therefore, TEMAZr gas or ozone gas supplied to the inside of the inner tube 204 can be restrained from flowing between the inner wall of the inner tube 204 and the gas penetration preventing cylinder 217f instead of flowing between the wafers 200, and thus supply of TEMAZr gas or ozone gas to gaps between wafers 200 held at lower positions can be facilitated. Therefore, it can be prevented that the velocity of supplied TEMAZr gas or ozone gas is lowered at the center parts of the lower-positioned wafers 200, and thus the uniformity of substrate processing quality can be improved in the surfaces of the wafers 200 and between the wafers 200.

However, in the case of the conventional substrate processing apparatus, as shown in FIG. 17, the distance between the inner wall of the inner tube 204' and the outer peripheries of the insulation plates 217g' held in the boat 217' is greater than the distance (stack pitch) between the stacked wafers 200. That is, the conductance of the space between the inner wall of the inner tube 204' and the outer peripheries of the insulation plates 217g' is greater than the conductance of a region where the wafers 200 are stacked. Therefore, instead of flowing between the wafers 200, gas supplied to the inside of the inner tube 204' can flow between the inner wall of the inner tube 204' and the outer peripheries of the insulation plates 217g', and thus the velocity of gas supplied to lower wafers 200 can be lowered (the amount of supplied gas can be reduced) to degrade the uniformity of substrate processing quality in the surfaces of the wafers 200 and between the wafers 200.

Figure 15:
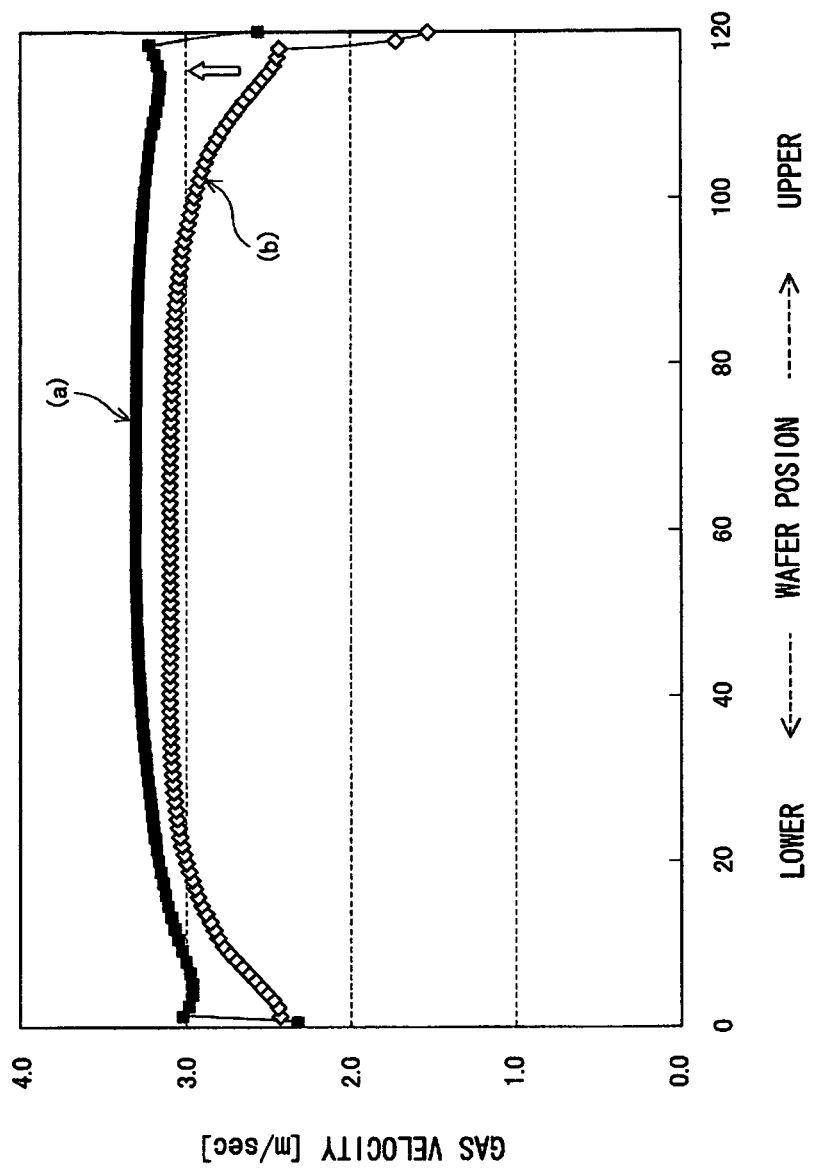
FIG. 15 is a graph showing measured velocities of gas supplied to the center parts of surfaces of wafers.

The effects explained in sections (a) to (c) are shown in FIG. 15. In FIG. 15, the horizontal axis denotes the position of wafers held in a boat—the left side of the horizontal axis denotes the lower inner side of the boat, and the right side of the horizontal axis denotes the upper inner side of the boat. The vertical axis denotes the velocity of gas measured at the centers of the surfaces of the wafers 200. The curve (a) indicated by ■ denotes measured values (Example) in the case of a substrate processing apparatus relevant to the current embodiment, and the curve (b) indicated by ◇ denotes measured values (Comparison Example) in the case of a conventional substrate processing apparatus. Referring to FIG. 15, it will be understood that the velocity of gas supplied to the center parts of the surfaces of wafers 200 held at upper or lower positions is less reduced in the case (curve (a)) of the substrate processing apparatus relevant to the current embodiment as compared with the case (curve (b)) of the conventional substrate processing apparatus. In addition, it will be understood that substrate processing efficiency can be increased because the velocity of gas can be entirely increased.

(d) According to the current embodiment, the top and bottom openings of the gas penetration preventing cylinder 217f are air-tightly closed by the cover plate 217e and the end plate 217d, respectively. Therefore, TEMAZr gas or ozone gas can be restrained from penetrating into the gas penetration preventing cylinder 217f and collecting in the gas penetration preventing cylinder 217f, and thus generation of particles that lowers substrate processing quality can be suppressed. However, in the case of the conventional substrate processing apparatus illustrated in FIG. 17, TEMAZr gas ozone gas can easily flow to a region of the boat 217' (where the insulation plates 217g' are stacked) lower than a region where the wafers 200 are stacked, and thus particles can be easily generated due to TEMAZr gas or ozone gas collected in the lower region of the boat 217'.

(e) According to the current embodiment, at the lower side of the sidewall of the gas penetration preventing cylinder 217f, at least one vent hole 217g is formed. In this way, by forming the vent hole 217g at the sidewall of the gas penetration preventing cylinder 217f, the inside of the inner tube 204 can be exhausted (pressure-adjusted) rapidly and stably. In addition, since the vent hole 217g is formed not at the upper side but at the lower side of the sidewall of the gas penetration preventing cylinder 217f, TEMAZr gas or ozone gas can be restrained from penetrating into the gas penetration preventing cylinder 217f, thereby suppressing generation of particles which are caused by source gas collected in the gas penetration preventing cylinder 217f and result in degradation of substrate processing quality.

As shown in FIG. 3, in the case where the top and bottom openings of the gas penetration preventing cylinder 217f are air-tightly closed by the cover plate 217e and the end plate 217d, respectively, and the inside of the gas penetration preventing cylinder 217f is previously evacuated (in the case where the gas penetration preventing cylinder 217f is configured as a vacuum cap shape), since gas flows are not generated toward and from the gas penetration preventing cylinder 217f, the inside of the inner tube 204 can be exhausted (pressure-adjusted) more rapidly and stably. By preventing gas from collecting in the gas penetration preventing cylinder 217f, generation of particles can also be suppressed.

(f) As shown in FIG. 5, the sidewall of the inner tube 204 relevant to the current embodiment is configured such that the sidewall of the inner tube 204 relevant to the current embodiment is configured such that the distance L2 between the outer edge of a wafer 200 accommodated in the inner tube 204 and the gas exhaust outlet 204a is greater than the distance L1 between the outer edge of the wafer 200 accommodated in the inner tube 204 and the vaporized gas injection hole 248a. Furthermore, the distance L2 between the outer edge of the wafer 200 accommodated in the inner tube 204 and the gas exhaust outlet 204a is greater than the distance L1 between the outer edge of the wafer 200 accommodated in the inner tube 204 and the reaction gas injection hole 248b. In this way, since the distance between the outer edge of the wafer and the gas exhaust outlets 204a is sufficiently long, a region where the velocity of a gas stream 10 increases can be relatively distant from the wafer 200 so that the velocity of the horizontal gas stream 10 can be uniform along the wafer 200. Therefore, the flowrate of gas supplied to the wafer 200 can be uniformly maintained, and thus film thickness uniformity can be improved.

Second Embodiment of the Present Invention

Hereinafter, a second embodiment of the present invention will be described with reference to the attached drawings.

Figure 4:
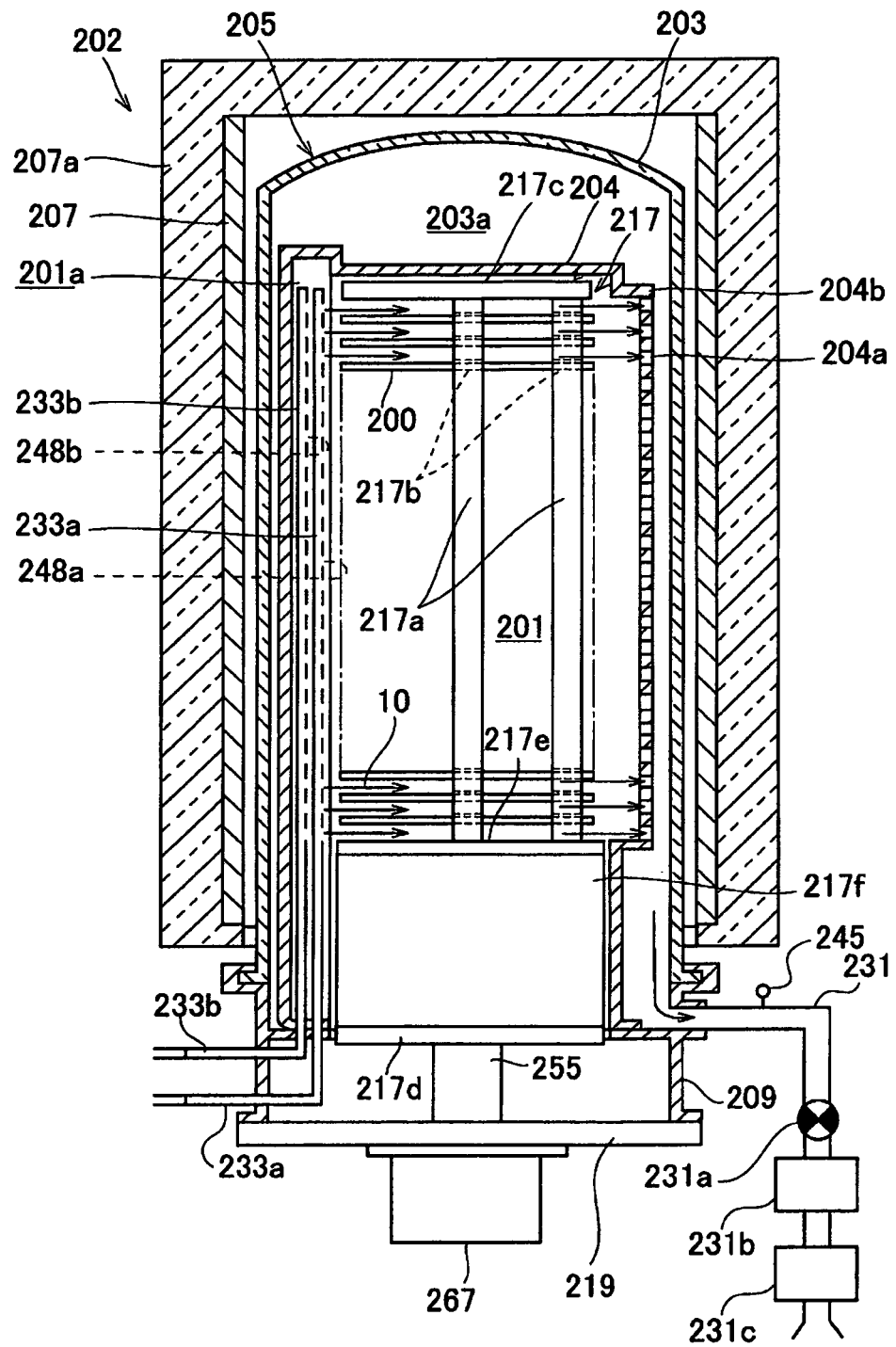
FIG. 4 is a vertical sectional view illustrating a process furnace provided in a substrate processing apparatus relevant to a second embodiment of the present invention.
Figure 10:
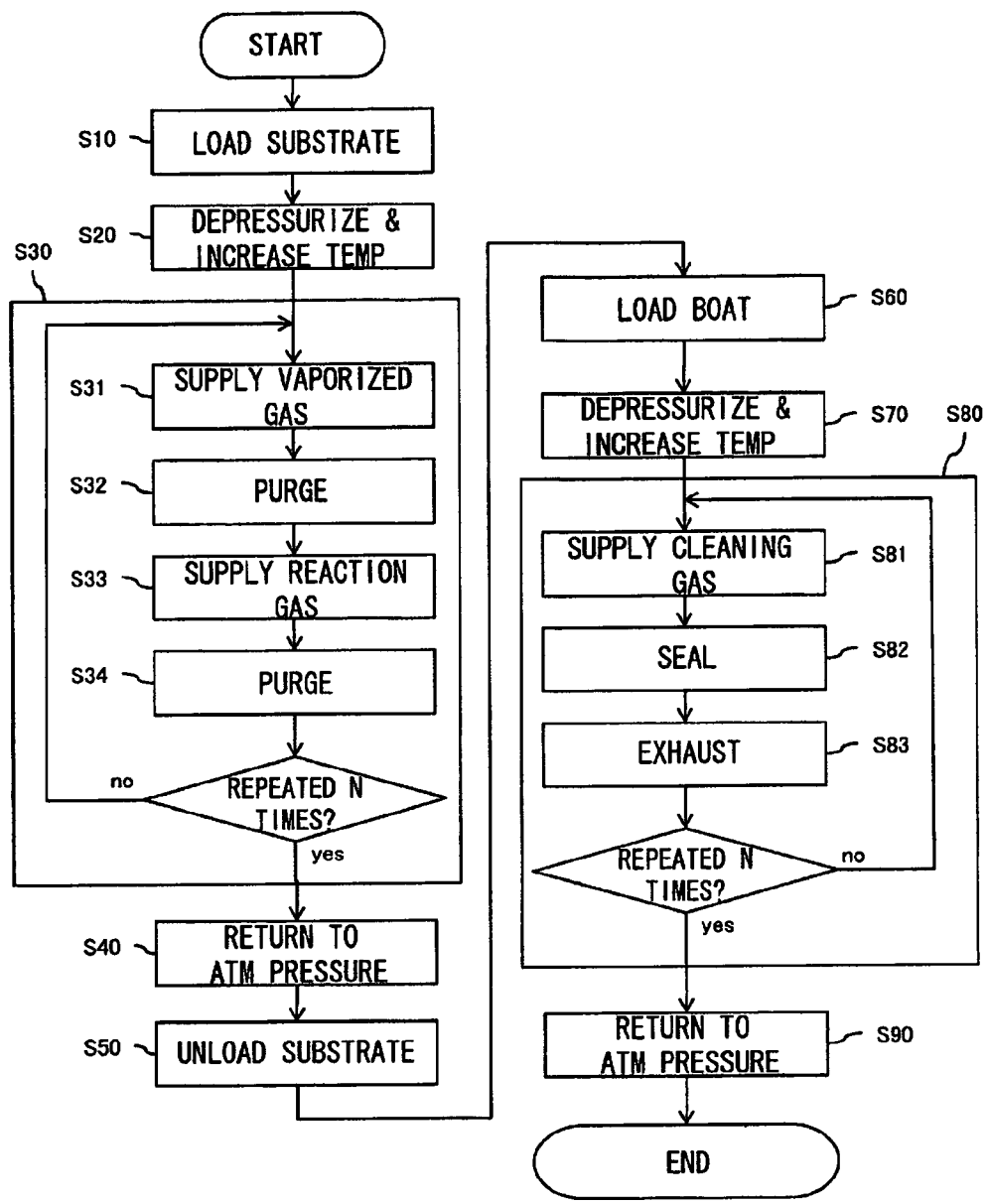
FIG. 10 is a flowchart for explaining a substrate processing process relevant to the second embodiment of the present invention.
Figure 12:
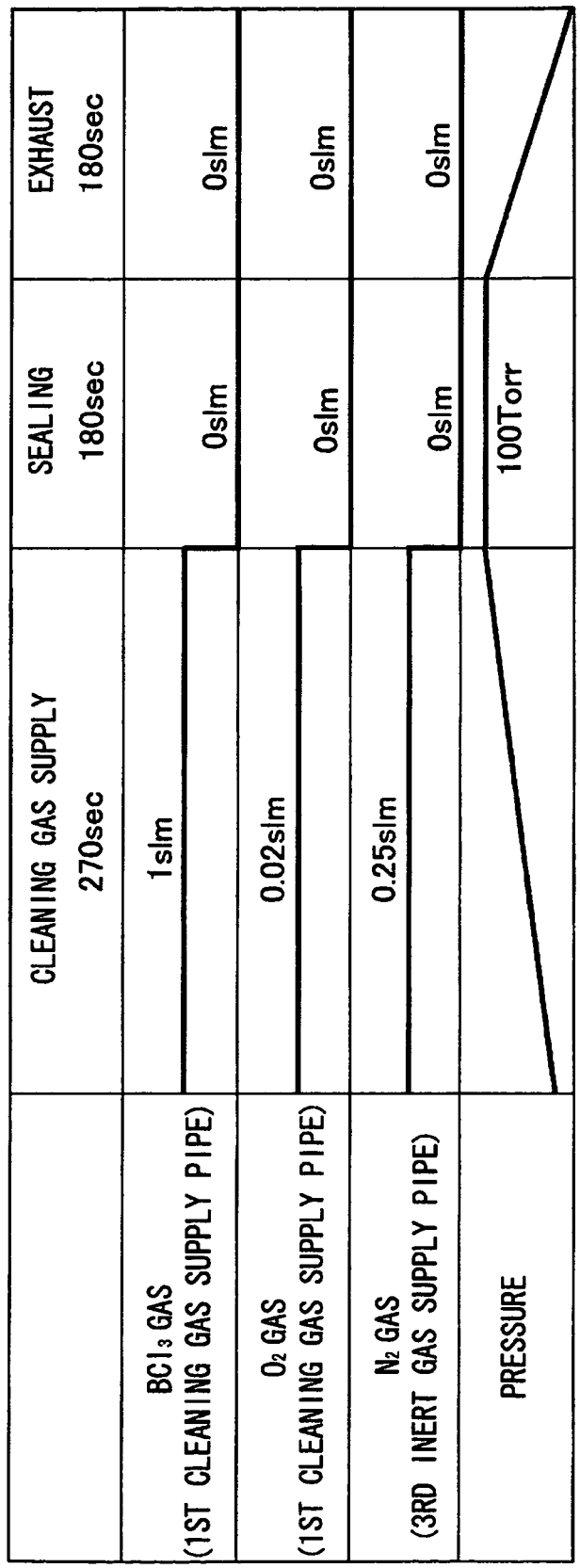
FIG. 12 is a gas supply sequence diagram of a cleaning process relevant to the second embodiment of the present invention.

FIG. 4 is a vertical sectional view illustrating a process furnace provided in a substrate processing apparatus relevant to the second embodiment of the present invention. FIG. 10 is a flowchart for explaining a substrate processing process relevant to the second embodiment of the present invention. FIG. 12 is a gas supply sequence diagram of a cleaning process relevant to the second embodiment of the present invention. FIG. 14 is a table showing exemplary process conditions of a cleaning process relevant to the second embodiment of the present invention.

(1) Structure of Substrate Processing Apparatus

The substrate processing apparatus relevant to the current embodiment is different from the substrate processing apparatus described in the previous embodiment in that a barrier gas supply unit is further provided to supply inert gas to a space between the inner wall of an inner tube 204 and a gas penetration preventing cylinder 217f in a state where a boat 217 is accommodated in the inner tube 204. In addition, the substrate processing apparatus relevant to the current embodiment is different from the substrate processing apparatus described in the previous embodiment in that a cleaning gas supply unit is further provided to supply cleaning gas to the inside of the inner tube 204 through a vaporized gas nozzle 233a and a reaction gas nozzle 233b. Other configurations are the same as those of the first embodiment.

(Barrier Gas Supply Unit)

For example, the barrier bas supply unit includes a barrier gas supply pipe 240k configured to supply inert gas such as $N_2$ gas to the inside of the inner tube 204 from a gap between a seal cap 219 and a rotation shaft 255. A barrier gas supply source (not shown) configured to supply inert gas such as $N_2$ gas, an MFC 242k, and an on-off valve 241k are sequentially installed from the upstream side of the barrier gas supply pipe 240k.

By opening the on-off valve 241k in a state where the boat 217 is accommodated in the inner tube 204, inert gas is supplied from the lower inner side to the upper inner side of the inner tube 204, and the inert gas is filled in the space between the sidewall of the inner tube 204 and the gas penetration preventing cylinder 217f. Therefore, TEMAZr gas or ozone gas can be restrained from penetrating into the space between the sidewall of the inner tube 204 and the gas penetration preventing cylinder 217f, and thus formation of a film can be suppressed on the lower side of the inner wall of the inner tube 204 or the sidewall of the gas penetration preventing cylinder 217f.

(Cleaning Gas Supply Unit)

The cleaning gas supply unit includes a first cleaning gas pipe 240m configured to supply first cleaning gas such as boron trichloride ($BCl_3$) gas, and a second cleaning gas pipe 240n configured to supply second cleaning gas such as oxygen ($O_2$) gas. The downstream side of the first cleaning gas pipe 240m is connected to a vaporized gas supply pipe 240a at the downstream side of an on-off valve 241a. The downstream side of the second cleaning gas pipe 240n is connected to a reaction gas supply pipe 240b at the downstream side of an on-off valve 241b. A first cleaning gas supply source (not shown) configured to supply $BCl_3$ gas, an MFC 242m, and an on-off valve 241m are sequentially installed from the upstream side of the first cleaning gas pipe 240m. A second cleaning gas supply source (not shown) configured to supply $O_2$ gas, an MFC 242n, and an on-off valve 241n are sequentially installed from the upstream side of the second cleaning gas pipe 240n.

By closing the on-off valve 241a and opening the on-off valve 241m, $BCl_3$ gas can be supplied to the inside of the inner tube 204 through the vaporized gas nozzle 233a. In addition, by closing the on-off valve 241b and opening the on-off valve 241n, $O_2$ gas can be supplied to the inside of the inner tube 204 through the reaction gas nozzle 233b. It is configured to such that $BCl_3$ gas and $O_2$ gas can be simultaneously supplied to the inside of the inner tube 204.

(2) Substrate Processing Process

A substrate processing process relevant to the current embodiment is different from the substrate processing process described in the previous embodiment in that inert gas is supplied to the space between the inner tube 204 and the gas penetration preventing cylinder 217f in a film forming operation S30. In addition, the substrate processing process relevant to the current embodiment is different from the substrate processing process described in the previous embodiment in that a cleaning operation S80 is performed to remove deposited substances such as thin films from the inner wall of the inner tube 204 or the like after performing the film forming operation S30 to a substrate unloading operation S50.

(Substrate Loading Operation S10 to Substrate Unloading Operation S50)

Like in the previous embodiment, the substrate loading operation S10 to the substrate unloading operation S50 are performed. In the current embodiment, when a cycle of a vaporized gas supply operation S31 to a purge operation S34 is repeated for a predetermined number of times, the on-off valve 241k is opened to supply $N_2$ gas (inert gas) to the inside of the inner tube 204 from the lower side to the upper side.

(Boat Loading Operation S60)

Next, the boat 217 in which wafers 200 are not charged is lifted by using the boat elevator 115 to load the boat 217 into the inner tube 204 (boat loading). In this state, the bottom side of a manifold 209 is sealed by the seal cap 219 with an O-ring 220b being disposed therebetween. In the boat loading operation S60, it is preferable that on-off valves 241g and 241h be opened for continuously supplying purge gas to the inside of the inner tube 204.

(Depressurizing and Temperature Increasing Operation S70)

Next, the on-off valve 241g and the on-off valve 241h are closed, and the inside of the inner tube 204 (the inside of a process chamber 201) is exhausted by using a vacuum pump 231b to a desired process pressure (vacuum degree). At this time, the opened area of an APC valve 231a is feedback controlled based on temperature information measured by using a pressure sensor 245. In addition, to keep the inside of the inner tube 204 at a desired temperature (process temperature), power supply to a heater 207 is controlled. At this time, power supply to the heater 207 is feedback controlled based on temperature information measured through a temperature sensor. Thereafter, the boat 217 is rotated by using a rotary mechanism 267.

Exemplary conditions at the end of the depressurizing and temperature increasing operation S70 are follows.

Process pressure: 1330 pa to 26600 Pa, preferably 1330 Pa
Process temperature: 300° C. to 700° C., preferably 540° C.

(Cleaning Operation S80)

Next, a cycle of a cleaning gas supply operation S81 to an exhaust operation (described later) is repeated for a predetermined number of times so as to remove thin films formed on the inner wall of the inner tube 204 or the sidewall of the gas penetration preventing cylinder 217f. FIG. 12 shows exemplary gas supply sequences of the cleaning gas supply operation S81 to the exhaust operation S83.

(Cleaning Gas Supply Operation S81)

First, the on-off valves 241m and 241n are opened in a state where the on-off valve 241a and the on-off valves 241g, 241b, and 241h are closed, so that the inside of the inner tube 204 in which the boat 217 is loaded can be simultaneously supplied with $BCl_3$ gas (first cleaning gas) through the vaporized gas nozzle 233a and $O_2$ gas (second cleaning gas) through the reaction gas nozzle 233b. In addition, the on-off valve 241k is opened to supply $N_2$ gas (inert gas) to the inside of the inner tube 204 in a direction from the lower side to the upper side. At this time, for example, the flowrate of $BCl_3$ gas supplied through the first cleaning gas pipe 240m may be 1 slm; the flowrate of $O_2$ gas supplied through the second cleaning gas pipe 240n may be 0.02 slm; and the flowrate of $N_2$ gas supplied through the barrier gas supply pipe 240k may be 0.25 slm.

If the inside pressure of the inner tube 204 reaches a predetermined process pressure (for example, 100 Torr) after a predetermined time (for example, 270 seconds), the on-off valves 241m, 241n, and 241k are closed to interrupt supplies of $BCl_3$ gas, $O_2$ gas, and $N_2$ gas to the inside of the inner tube 204.

In addition, for example, the APC valve 231a is closed for substantially stopping exhaustion of the inside of the process chamber 201 (the inside of the inner tube 204) through an exhaust line.

(Sealing Operation S82)

Next, in a state where the exhaustion of the inside of the process tube 205 (the inside of the inner tube 204) is substantially stopped, the inner tube 204 in which $BCl_3$ gas (first cleaning gas) and $O_2$ gas (second cleaning gas) remain at a predetermined pressure (100 Torr) is sealed for a predetermined time (for example, 180 seconds). As a result, thin films formed on places such as the inner wall of the inner tube 204 or the sidewall of the gas penetration preventing cylinder 217f are etched, and thus gas such as Zr chloride or Hf chloride is generated.

(Exhaust Operation S83)

Next, cleaning gas is exhausted from the inside of the inner tube 204. That is, in a state where the on-off valves 241a, 241g, 241b, 241h, 241m, 241n, and 241k are closed, the APC valve 231a is opened to exhaust gas (such as cleaning gas, Zr chloride gas, or Hf chloride gas) remaining in the process tube 205. At this time, the on-off valves 241g and 241h can be opened to supply inert gas (purge gas) to the inside of the inner tube 204 so as to facilitate discharge of remaining gas from the inner tube 204.

Thereafter, a cycle of the cleaning gas supply operation S81 to the exhaust operation S83 is repeated for a predetermined number of times so as to etch thin films formed on the inner wall of the inner tube 204 or the sidewall of the gas penetration preventing cylinder 217f (S80). The process conditions of the cleaning gas supply operation S81 are not limited to the above-mentioned values or ranges. For example, the process conditions shown in FIG. 14 can be used.

<Process Conditions of Cleaning Gas Supply Operation S81>

Process pressure: 1330 Pa to 26600 Pa, preferably 13300 Pa $BCl_3$ gas flowrate: 0.001 slm to 5 slm, preferably 1 slm $O_2$ gas flowrate: 0 to 0.05 slm, preferably 1.0 slm $N_2$ gas flowrate: 0.1 slm to 1 slm, preferably 0.15 slm Process temperature: 300° C. to 700° C., preferably 540° C.

Thereafter, the opened area of the APC valve 231a is reduced, and the on-off valves 241g and 241h are opened to supply purge gas to the inside of the inner tube 204 until the inside pressure of the process tube 205 (the inside pressures of the inner tube 204 and the outer tube 203) becomes atmospheric pressure (S90).

(3) Effects Relevant to the Current Embodiment

According to the current embodiment, one or more effects can be attained as follows.

(a) According to the current embodiment, when a cycle of the vaporized gas supply operation S31 to the purge operation S34 is repeated for a predetermined number of times, the on-off valve 241k is opened to supply $N_2$ gas (inert gas) to the inside of the inner tube 204 from the lower side to the upper side. As a result, $N_2$ gas is filled in the space between the inner wall of the inner tube 204 and the gas penetration preventing cylinder 217f, which suppresses penetration of TEMAZr gas or ozone gas into the space between the inner wall of the inner tube 204 and the gas penetration preventing cylinder 217f, and thus formation of films on the lower side of the inner wall of the inner tube 204 or the sidewall of the gas penetration preventing cylinder 217f can be suppressed.

(b) According to the current embodiment, since formation of thin films on the lower side of the inner wall of the inner tube 204 or the sidewall of the gas penetration preventing cylinder 217f can be suppressed, although thin films are formed on the lower side of the inner wall of the inner tube 204 or the sidewall of the gas penetration preventing cylinder 217f, the thin films can be etched more rapidly and completely by performing the cleaning operation S80.

Figure 16A:
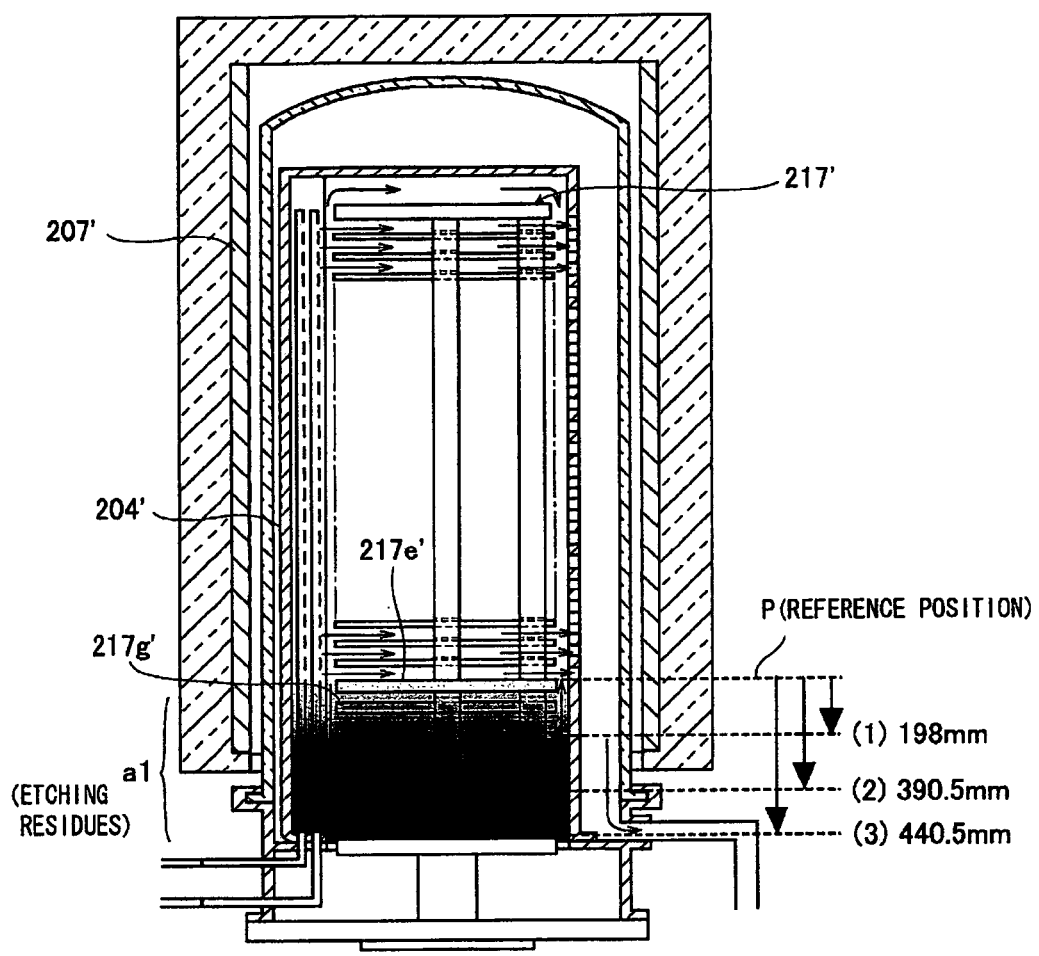
FIG. 16A is a schematic view illustrating positions of etching residues remaining in a conventional substrate processing apparatus.
Figure 16B:
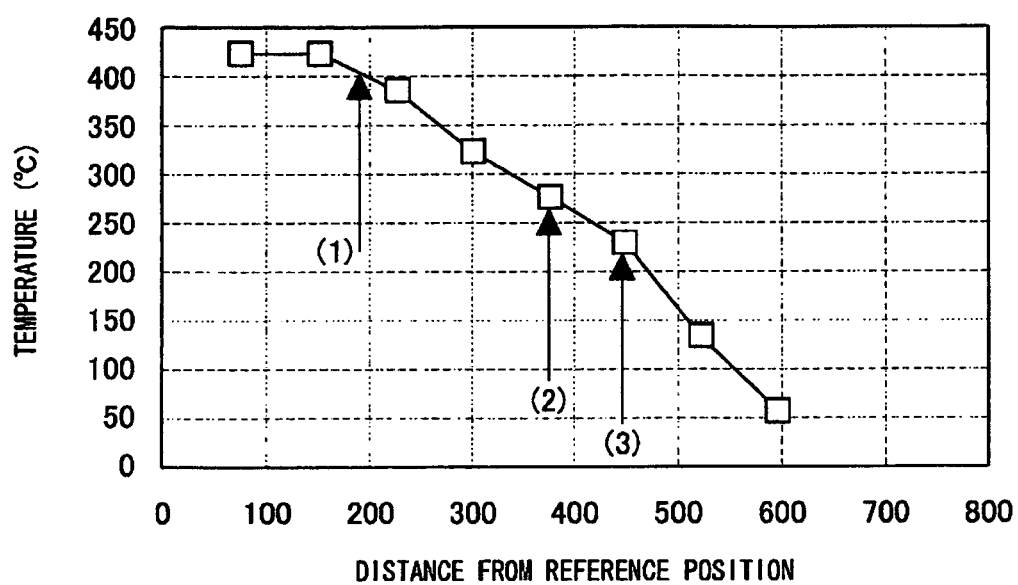
FIG. 16B is a graph showing temperature distribution at the positions of etching residues.

As described above, in the conventional substrate processing apparatus shown in FIG. 17, gas supplied to the inside of the inner tube 204' may flow in a space between the lower side of the inner wall of the inner tube 204' and the outer peripheries of the insulation plates 217g' instead of flowing between wafers 200. Therefore, somewhat thick films can be formed on the lower side of the inner wall of the inner tube 204' or the insulation plates 217g'. Furthermore, when the boat 217' is accommodated in the inner tube 204', the lower part of the inner tube 204' or the insulation plates 217g' are located lower than a region heated by the heater 207'. Therefore, although a cleaning process is performed to supply cleaning gas to the inside of the inner tube 204', since the temperature of the lower part of the inner tube 204' or the insulation plates 217g' is not sufficiently increased, etching rate may be low, and etching residues (thin films which are not removed) may exist on the lower side of the inner wall of the inner tube 204' or the insulation plates 217g'. FIG. 16A is a schematic view illustrating positions of etching residues remaining in a conventional substrate processing apparatus, and FIG. 16B is a graph showing a temperature distribution at the positions of etching residues. Referring to FIG. 16A, etching residues can be observed at the lower side of the inner wall of the inner tube 204' or the insulation plates 217g' (region a1 in FIG. 16A). In addition, referring to FIG. 16B, it can be understood that temperature gradually decreases as it goes downward in the region a1 where etching residues are exist, and this means that the etching rate decreases as it goes downward.

In the substrate processing apparatus relevant to the current embodiment, when the boat 217 is accommodated in the inner tube 204, at least a part of the gas penetration preventing cylinder 217f is also located lower than a region heated by the heater 207. Therefore, when the cleaning operation S80 is performed, the temperature of the lateral surface of the gas penetration preventing cylinder 217f, or the temperature of the lower side of the inner wall of the inner tube 204 facing the gas penetration preventing cylinder 217f is lower than the temperature of a region where wafers 200 are stacked. However, in the current embodiment, since formation of films can be suppressed at places such as the inner wall of the inner tube 204 or the sidewall of the gas penetration preventing cylinder 217f, although the gas penetration preventing cylinder 217f is located lower than the region heated by the heater 207 (that is, although the etching rate is decreases), the above-described problems can be solved.

Other Embodiments of the Present Invention

In the above-described embodiments, a material such as TEMAZr is used as a liquid source; however, the present invention is not limited thereto. That is, tetrakis(ethylmethylamino)hafnium (TEMAH) may be used as a liquid source, or an organic compound or chloride including one of silicon (Si), hafnium (Hf), zirconium (Zr), aluminum (Al), titanium (Ti), tantalum (Ta), ruthenium (Ru), iridium (Ir), germanium (Ge), antimony (Sb), and tellurium (Te) may be used as a liquid source. Furthermore, although TEMAZr gas obtained by vaporizing TEMAZr is used as a first source gas in the above-described embodiments, the present invention is not limited thereto. For example, TEMAH gas obtained by vaporizing TEMAH may be used as a first source gas, or gas obtained by vaporizing or decomposing an organic compound or chloride including one of silicon (Si), hafnium (Hf), zirconium (Zr), aluminum (Al), titanium (Ti), tantalum (Ta), ruthenium (Ru), iridium (Ir), germanium (Ge), antimony (Sb), and tellurium (Te) may be used as a first source gas.

In the above-described embodiments, ozone gas (oxidizer) is used as a reaction gas. However, other oxidizers can be used. In addition, a nitriding agent such as ammonia may be used as a reaction gas.

In the above-described embodiments, explanations are given on the case where a $ZrO_2$ film is formed on a wafer 200. However, the present invention can also be optimally applied to the case where one of a hafnium (Hf) oxide film, a silicon (Si) oxide film, an aluminum (Al) oxide film, a titanium (Ti) oxide film, a tantalum (Ta) oxide film, a ruthenium (Ru) oxide film, an iridium (Ir) oxide film, a silicon (Si) nitride film, an aluminum (Al) nitride film, a titanium (Ti) nitride film, and a GeSbTe film is formed.

In the above-described embodiments, explanations are given on the case of using an ALD method in which vaporized gas used as a first source gas and reaction gas used as a second source gas are alternately supplied to a wafer 200. However, the present invention is not limited thereto. For example, the present invention can be optimally applied to the case of using other methods such as a CVD method in which first and second source gases are simultaneously supplied to a wafer 200. In addition, the present invention is not limited to the case where two kinds of gases are supplied to a wafer 200. For example, the present invention can be optimally applied to the case where a kind of gas is supplied or three or more kinds of gases are supplied.

As described above, according to the substrate processing apparatus and the semiconductor device manufacturing method relevant to the present invention, it can be prevented that the velocity of source gas decreases at the center surface parts of substrates held at upper or lower positions of the substrate holder in which a plurality of substrates are held, and thus, the uniformity of substrate processing quality can be improved in the surfaces of the substrates and between the substrates.

Preferred Embodiments of the Present Invention

The present invention also includes the following embodiments.

(Supplementary Note 1)
According to a preferred embodiment of the present invention, there is provided a substrate processing apparatus including: a substrate holder configured to hold a plurality of substrates in a state where the substrate are horizontally oriented and stacked; an inner tube configured to accommodate the substrate holder; an outer tube configured to enclose the inner tube; a gas nozzle installed in the inner tube; a gas injection hole formed in the gas nozzle; a source gas supply unit configured to supply a source gas to an inside of the inner tube through the gas nozzle; a gas exhaust outlet formed in a sidewall of the inner tube; an exhaust unit configured to exhaust a gap between the outer tube and the inner tube so as to create a gas stream inside the inner tube in a direction from the gas injection hole to the gas exhaust outlet; and a gas penetration preventing cylinder configured to enclose a region of the substrate holder lower than a region of the substrate holder where the substrates are stacked.

(Supplementary Note 2)
Preferably, the substrate processing apparatus further may include a heating unit installed around an outer periphery of the outer tube, and in a state where the substrate holder is accommodated in the inner tube, at least a part of the gas penetration preventing cylinder may be located lower than a region heated by the heating unit.

(Supplementary Note 3)
Preferably, upper and lower ends of the gas penetration preventing cylinder may be air-tightly sealed, and at least one vent hole may be formed in a lower side of a sidewall of the gas penetration preventing cylinder.

(Supplementary Note 4)
Preferably, upper and lower ends of the gas penetration preventing cylinder may be air-tightly sealed, and an inside of the gas penetration preventing cylinder may be vacuum-exhausted.

(Supplementary Note 5)
Preferably, the gas penetration preventing cylinder may include a cylinder made of quartz or silicon carbide.

(Supplementary Note 6)
Preferably, the substrate holder may include an upper end plate, and an upper end of the inner tube may be closed by a top plate, wherein in a state where the substrate holder is accommodated in the inner tube, a distance between the upper end plate of the substrate holder and the top plate of the inner tube may be shorter than a distance between the stacked substrates.

(Supplementary Note 7)
Preferably, a distance between an inner wall of the inner tube and the gas penetration preventing cylinder may be shorter than a distance between a distance between the stacked substrates.

(Supplementary Note 8)
Preferably, the substrate processing apparatus may further include a barrier gas supply unit configured to supply an inert gas to a space between an inner wall of the inner tube and the gas penetration preventing cylinder in a state where the substrate holder is accommodated in the inner tube.

(Supplementary Note 9)
Preferably, the substrate processing apparatus may further include: a cover body configured to seal a lower opening of the outer tube air-tightly; a rotation shaft disposed through the cover body for supporting the substrate holder from a lower side of the substrate holder; and a rotary unit configured to rotate the rotation shaft, wherein the barrier gas supply unit supplies an inert gas to a gap between the cover body and the rotation shaft.

(Supplementary Note 10)

Preferably, the substrate processing apparatus may further include a control unit configured to control the source gas supply unit and the barrier gas supply unit so as to supply an inert gas to the space between the inner wall of the inner tube and the gas penetration preventing cylinder when a source gas is supplied to the inside of the inner tube.

(Supplementary Note 11)

Preferably, the substrate processing apparatus may further include a cleaning gas supply unit configured to supply a cleaning gas to the inside of the inner tube through the gas nozzle.

(Supplementary Note 12)

Preferably, the substrate processing apparatus may further include a control unit configured to control the cleaning gas supply unit and the barrier gas supply unit so as to supply an inert gas to the space between the inner wall of the inner tube and the gas penetration preventing cylinder when a cleaning gas is supplied to the inside of the inner tube.

(Supplementary Note 13)

According to another preferred embodiment of the present invention, there is provided a method of manufacturing a semiconductor device, the method including: loading a substrate holder into an inner tube, the substrate holder holding a plurality of substrates in a state where the substrate are horizontally oriented and stacked; forming thin films on the substrates by supplying a source gas to an inside of the inner tube; and unloading the substrate holder from the inner tube, wherein the forming of the thin films is performed in a state where a region of the substrate holder lower than a region of the substrate holder where the substrates are stacked is enclosed by a gas penetration preventing cylinder.

(Supplementary Note 14)

Preferably, in the forming of the thin films, an inert gas may be supplied to a space between the inner tube and the gas penetration preventing cylinder.

(Supplementary Note 15)

Preferably, the forming of the thin films may include: supplying a first source gas to the inside of the inner tube; exhausting the first source gas from the inside of the inner tube; supplying a second source gas to the inside of the inner tube; and exhausting the second source gas from the inside of the inner tube, wherein the supplying of the first source gas, the exhausting of the first source gas, the supplying of the second source gas, and the exhausting of the second source gas are grouped as a cycle, and the cycle is repeated.

(Supplementary Note 16)

Preferably, the method may further include a cleaning operation which includes: supplying a cleaning gas to the inside of the inner tube where the substrate holder is loaded; substantially stopping exhaustion of the inside of the inner tube, and sealing the inner tube, in which the cleaning gas remains, for a predetermined time; and exhausting the cleaning gas from the inside of the inner tube, wherein the supplying of the cleaning gas, the stopping of the exhaustion, and the exhausting of the cleaning gas are grouped as a cycle, and the cycle is repeated.

(Supplementary Note 17)

Preferably, in the supplying of the cleaning gas, an inert gas may be supplied to the space between the inner tube and the gas penetration preventing cylinder.

What is claimed is:

1. A substrate processing apparatus comprising:
    a substrate holder comprising a substrate stacking part configured to hold a plurality of vertically stacked substrates and a cylinder part disposed under the substrate stacking part to enclose a lower portion of the substrate holder,
    wherein the cylinder part is disposed lower than a lowermost one of a plurality of gas exhaust outlets and a lowermost one of a plurality of gas injection holes and is configured to prevent gas from flowing into the lower portion of the substrate holder;
    an inner tube configured to accommodate the substrate holder,
    wherein a space between the cylinder part and a lower portion of the inner tube is smaller than a space between the substrate stacking part and the upper portion of the inner tube, and
    wherein a distance between an inner wall of the inner tube and the cylinder part is shorter than a distance between two neighboring substrates of the plurality of vertically stacked substrates;
    an outer tube configured to enclose the inner tube with a gap therebetween,
    wherein a portion of the gap at the lower portion of the inner tube is larger than a portion of the gap at the upper portion of the inner tube;
    a gas nozzle installed in the inner tube,
    wherein the plurality of gas injection holes are disposed in the gas nozzle;
    a source gas supply unit configured to supply a source gas to an inside of the inner tube through the gas nozzle,
    wherein the plurality of gas exhaust outlets are disposed opposite to the gas nozzle in a manner that the lowermost one of the plurality of gas exhaust outlets faces the lowermost one of the plurality of gas injection holes and that the inside of the inner tube communicates with the gap through the plurality of gas exhaust outlets; and
    an exhaust unit configured to exhaust the gap so as to create a gas stream inside the inner tube in a direction from the plurality of gas injection holes to the plurality of gas exhaust outlets.

2. The substrate processing apparatus of claim 1, further comprising:
    a heating unit installed around an outer periphery of the outer tube,
    wherein at least a part of the cylinder part is located lower than a region heated by the heating unit when the substrate holder is accommodated in the inner tube.

3. The substrate processing apparatus of claim 1, wherein upper and lower ends of the cylinder part are air-tightly sealed, and at least one vent hole is disposed at a lower side of a sidewall of the cylinder part.

4. The substrate processing apparatus of claim 1, wherein upper and lower ends of the cylinder part are air-tightly sealed, and an inside of the cylinder part is vacuum-exhausted.

5. The substrate processing apparatus of claim 1, wherein the cylinder part is made of quartz or silicon carbide.

6. The substrate processing apparatus of claim 1,
    wherein the substrate holder comprises an upper end plate, and the inner tube comprises a top plate closing an upper end thereof, and
    wherein a distance between the upper end plate of the substrate holder and the top plate of the inner tube is shorter than a distance between the plurality of substrates stacked in the substrate stacking part when the substrate holder is accommodated in the inner tube.

7. The substrate processing apparatus of claim 1, further comprising:

a barrier gas supply unit configured to supply an inert gas to the space between the cylinder part and the lower portion of the inner tube.

8. The substrate processing apparatus of claim 7, further comprising:

a cover body configured to air-tightly seal a lower opening of the outer tube;

a rotation shaft disposed through the cover body for supporting the substrate holder from a lower side thereof; and a rotary unit configured to rotate the rotation shaft, wherein the barrier gas supply unit supplies an inert gas into a gap between the cover body and the rotation shaft.

9. A substrate processing apparatus comprising:

a substrate holder comprising a substrate stacking part configured to hold a plurality of vertically stacked substrates and a cylinder part disposed under the substrate stacking part to enclose a lower portion of the substrate holder, wherein the cylinder part being configured to prevent gas from flowing into the lower portion of the substrate holder;

an inner tube configured to accommodate the substrate holder, wherein an inner diameter and an outer diameter at a lower portion of the inner tube are smaller than an inner diameter and an outer diameter at an upper portion of the inner tube, respectively, such that a space between the cylinder part and the lower portion of the inner tube is smaller than a space between the substrate stacking part and the upper portion of the inner tube, and wherein a distance between an inner wall of the inner tube and the cylinder part is shorter than a distance between two neighboring substrates of the plurality of vertically stacked substrates;

an outer tube configured to enclose the inner tube with a gap therebetween, wherein a portion of the gap at the lower portion is larger than a portion of the gap at the upper portion;

a gas nozzle installed in the inner tube;

a gas injection hole disposed in the gas nozzle;

a source gas supply unit configured to supply a source gas to an inside of the inner tube through the gas nozzle;

a gas exhaust outlet disposed in a sidewall of the inner tube such that the inside of the inner tube communicates with the gap through the gas exhaust outlet; and an exhaust unit configured to exhaust the gap so as to create a gas stream inside the inner tube in a direction from the gas injection hole to the gas exhaust outlet.

10. The substrate processing apparatus of claim 9, wherein a distance between an outer surface of the lower portion of the inner tube and the cylinder part is shorter than a distance between an outer surface of the upper portion of the inner tube and the substrate stacking part.

* * * * *